United States Patent
Okumura

(10) Patent No.: US 10,068,823 B2
(45) Date of Patent: Sep. 4, 2018

(54) SEMICONDUCTOR DEVICE

(71) Applicant: ROHM CO., LTD., Kyoto-shi, Kyoto (JP)

(72) Inventor: Hiroshi Okumura, Kyoto (JP)

(73) Assignee: ROHM CO., LTD., Kyoto (JP)

(*) Notice: Subject to any disclaimer, the term of this patent is extended or adjusted under 35 U.S.C. 154(b) by 147 days.

(21) Appl. No.: 15/347,861

(22) Filed: Nov. 10, 2016

(65) Prior Publication Data
US 2017/0062301 A1    Mar. 2, 2017

Related U.S. Application Data

(63) Continuation of application No. 14/722,895, filed on May 27, 2015, now Pat. No. 9,508,672, which is a (Continued)

(30) Foreign Application Priority Data

Jul. 9, 2010 (JP) ................................. 2010-156372

(51) Int. Cl.
H01L 23/31 (2006.01)
H01L 23/498 (2006.01)
(Continued)

(52) U.S. Cl.
CPC ...... *H01L 23/3128* (2013.01); *H01L 23/3114* (2013.01); *H01L 23/3192* (2013.01); *H01L 23/49811* (2013.01); *H01L 23/49816* (2013.01); *H01L 23/49822* (2013.01); *H01L 23/49827* (2013.01); *H01L 23/49838* (2013.01); *H01L 23/5226* (2013.01); *H01L 24/03* (2013.01); *H01L 24/05* (2013.01); *H01L 24/08* (2013.01);
(Continued)

(58) Field of Classification Search
CPC ............................ H01L 24/17; H01L 23/3128
See application file for complete search history.

(56) References Cited

U.S. PATENT DOCUMENTS 8,624,391 B2   1/2014 Chen
2003/0145460 A1   8/2003 Jessep
(Continued)

FOREIGN PATENT DOCUMENTS

JP   2004-22650   1/2004
JP   2007-250564   9/2007
(Continued)

*Primary Examiner* — Moazzam Hossain
(74) *Attorney, Agent, or Firm* — Hamre, Schumann, Mueller & Larson, P.C.

(57) ABSTRACT

A semiconductor device suitable for preventing malfunction is provided.

The semiconductor device includes a semiconductor chip 1, a first electrode pad 21 laminated on the semiconductor chip 1, an intermediate layer 4 having a rectangular shape defined by first edges 49a and second edges, and a plurality of bumps 5 arranged to sandwich the intermediate layer 4 by cooperating with the semiconductor chip 1. The first edges 49a extend in the direction x, whereas the second edges extend in the direction y. The plurality of bumps 5 include a first bump 51 electrically connected to the first electrode pad 21 and a second bump 52 electrically connected to the first electrode pad 21. The first bump 51 is arranged at one end in the direction x and one end in the direction y.

25 Claims, 25 Drawing Sheets

Related U.S. Application Data continuation of application No. 13/809,211, filed as application No. PCT/JP2011/065693 on Jul. 8, 2011, now Pat. No. 9,070,673.

(51) Int. Cl.

| | | |
|---|---|---|
| *H01L 23/522* | (2006.01) | |
| *H01L 23/525* | (2006.01) | |
| *H01L 23/00* | (2006.01) | |
| H01L 23/532 | (2006.01) | |

(52) U.S. Cl.
CPC .............. *H01L 24/09* (2013.01); *H01L 24/11* (2013.01); *H01L 24/13* (2013.01); *H01L 24/14* (2013.01); *H01L 24/17* (2013.01); *H01L 23/525* (2013.01); *H01L 23/53238* (2013.01); *H01L 24/45* (2013.01); *H01L 24/48* (2013.01); *H01L 2224/024* (2013.01); *H01L 2224/0239* (2013.01); *H01L 2224/02313* (2013.01); *H01L 2224/02331* (2013.01); *H01L 2224/0346* (2013.01); *H01L 2224/0384* (2013.01); *H01L 2224/0391* (2013.01); *H01L 2224/0401* (2013.01); *H01L 2224/04042* (2013.01); *H01L 2224/05008* (2013.01); *H01L 2224/05541* (2013.01); *H01L 2224/05555* (2013.01); *H01L 2224/05569* (2013.01); *H01L 2224/05571* (2013.01); *H01L 2224/05582* (2013.01); *H01L 2224/05647* (2013.01); *H01L 2224/05655* (2013.01); *H01L 2224/05666* (2013.01); *H01L 2224/05684* (2013.01); *H01L 2224/11849* (2013.01); *H01L 2224/131* (2013.01); *H01L 2224/13023* (2013.01); *H01L 2224/1403* (2013.01); *H01L 2224/1411* (2013.01); *H01L 2224/1412* (2013.01); *H01L 2224/16225* (2013.01); *H01L 2224/16227* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48465* (2013.01); *H01L 2224/48599* (2013.01); *H01L 2224/48699* (2013.01); *H01L 2224/48799* (2013.01); *H01L 2224/48847* (2013.01); *H01L 2224/48855* (2013.01); *H01L 2224/48866* (2013.01); *H01L 2224/48884* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01014* (2013.01); *H01L 2924/01028* (2013.01); *H01L 2924/01029* (2013.01); *H01L 2924/01033* (2013.01); *H01L 2924/01058* (2013.01); *H01L 2924/01074* (2013.01); *H01L 2924/01078* (2013.01); *H01L 2924/01079* (2013.01); *H01L 2924/14* (2013.01); *H01L 2924/15183* (2013.01); *H01L 2924/15311* (2013.01); *H01L 2924/181* (2013.01); *H01L 2924/384* (2013.01)

(56) References Cited

U.S. PATENT DOCUMENTS

| | | |
|---|---|---|
| 2003/0218243 A1 | 11/2003 | Chen |
| 2003/0218246 A1 | 11/2003 | Abe et al. |
| 2005/0062151 A1 | 3/2005 | Nagao |
| 2005/0194169 A1 | 9/2005 | Tonomura |
| 2006/0060961 A1* | 3/2006 | Lin ................... H01L 23/3114 257/700 |
| 2006/0076679 A1 | 4/2006 | Batchelor et al. |
| 2006/0180928 A1* | 8/2006 | Takahira ............. H01L 23/3114 257/737 |
| 2007/0069346 A1 | 3/2007 | Lin et al. |
| 2007/0176294 A1 | 8/2007 | Wada |
| 2008/0067677 A1* | 3/2008 | Lin ................... H01L 23/49816 257/738 |
| 2008/0138937 A1 | 6/2008 | Yamagata |
| 2008/0150134 A1 | 6/2008 | Shinkai et al. |
| 2008/0272368 A1 | 11/2008 | Do |
| 2008/0303144 A1 | 12/2008 | Kasai |
| 2009/0140441 A1 | 6/2009 | Camacho et al. |
| 2009/0236739 A1* | 9/2009 | Chen ................... B23K 1/0016 257/737 |
| 2009/0279275 A1 | 11/2009 | Ayotte |
| 2011/0018129 A1 | 1/2011 | Suzuki |
| 2011/0084390 A1 | 4/2011 | Chen |
| 2011/0241218 A1 | 10/2011 | Meyer et al. |
| 2014/0094001 A1 | 4/2014 | Masuda |

FOREIGN PATENT DOCUMENTS

| | | |
|---|---|---|
| JP | 2008-159949 | 7/2008 |
| JP | 2009-55028 | 3/2009 |

\* cited by examiner

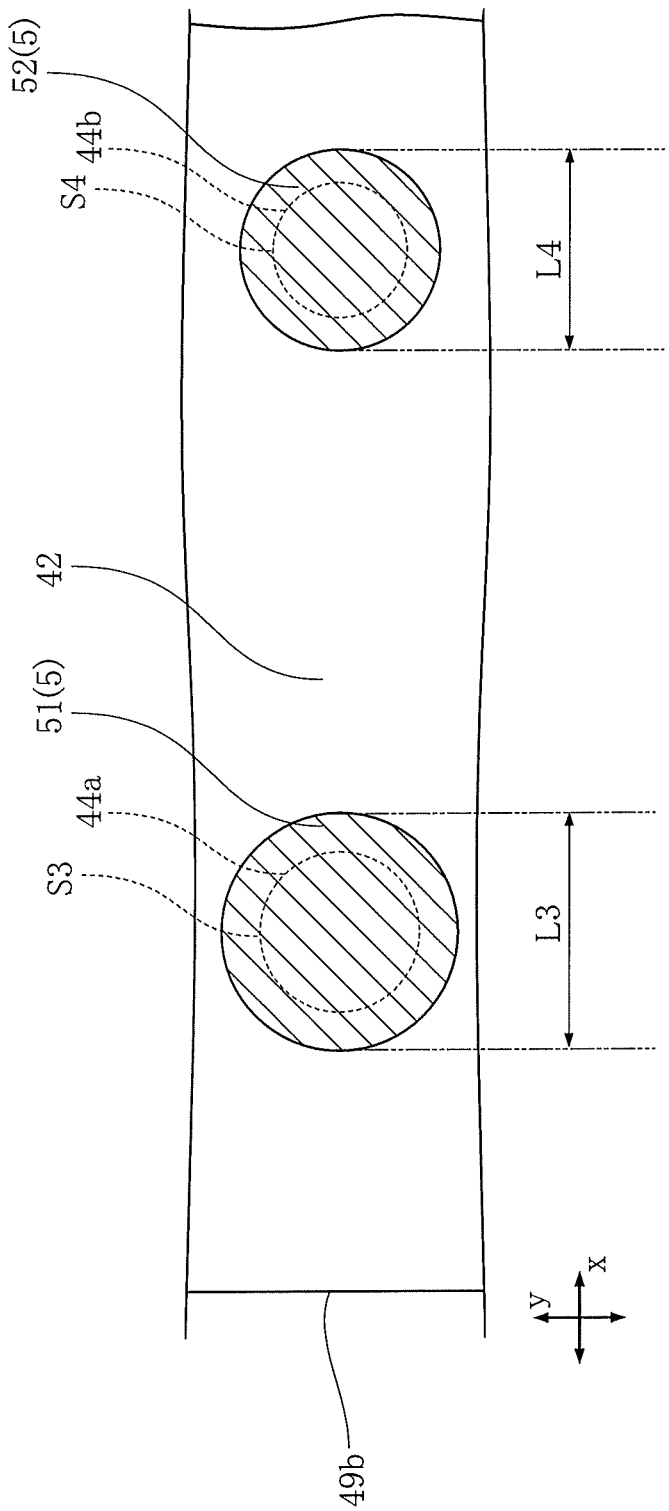

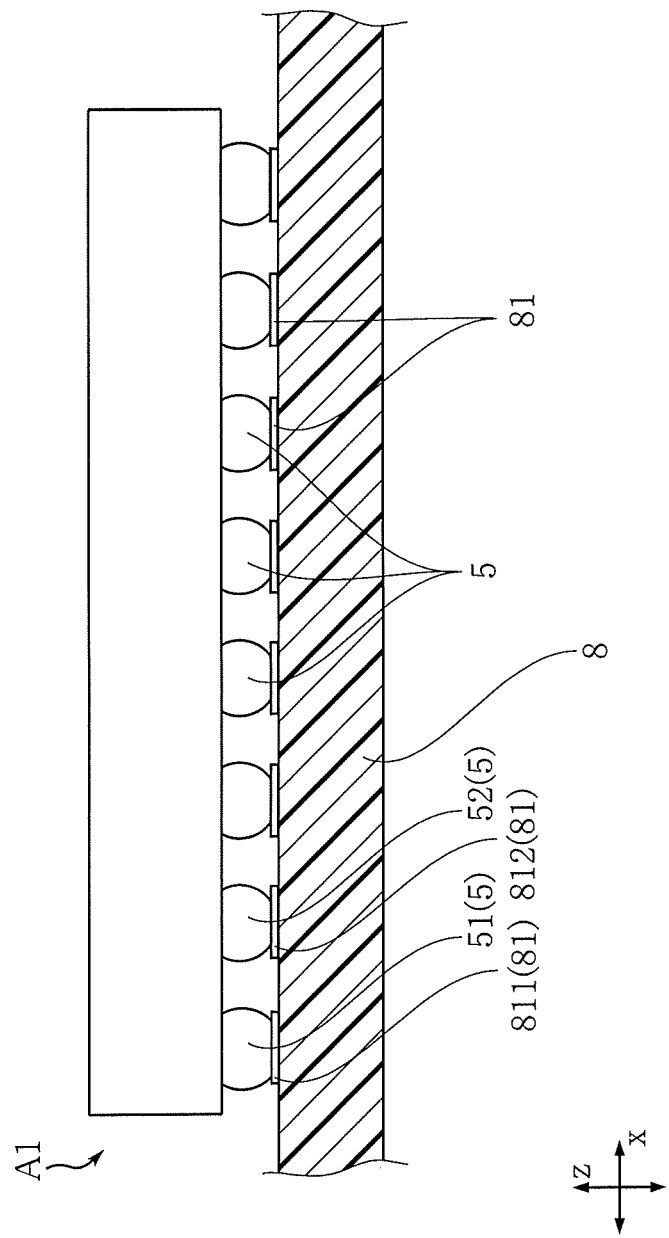

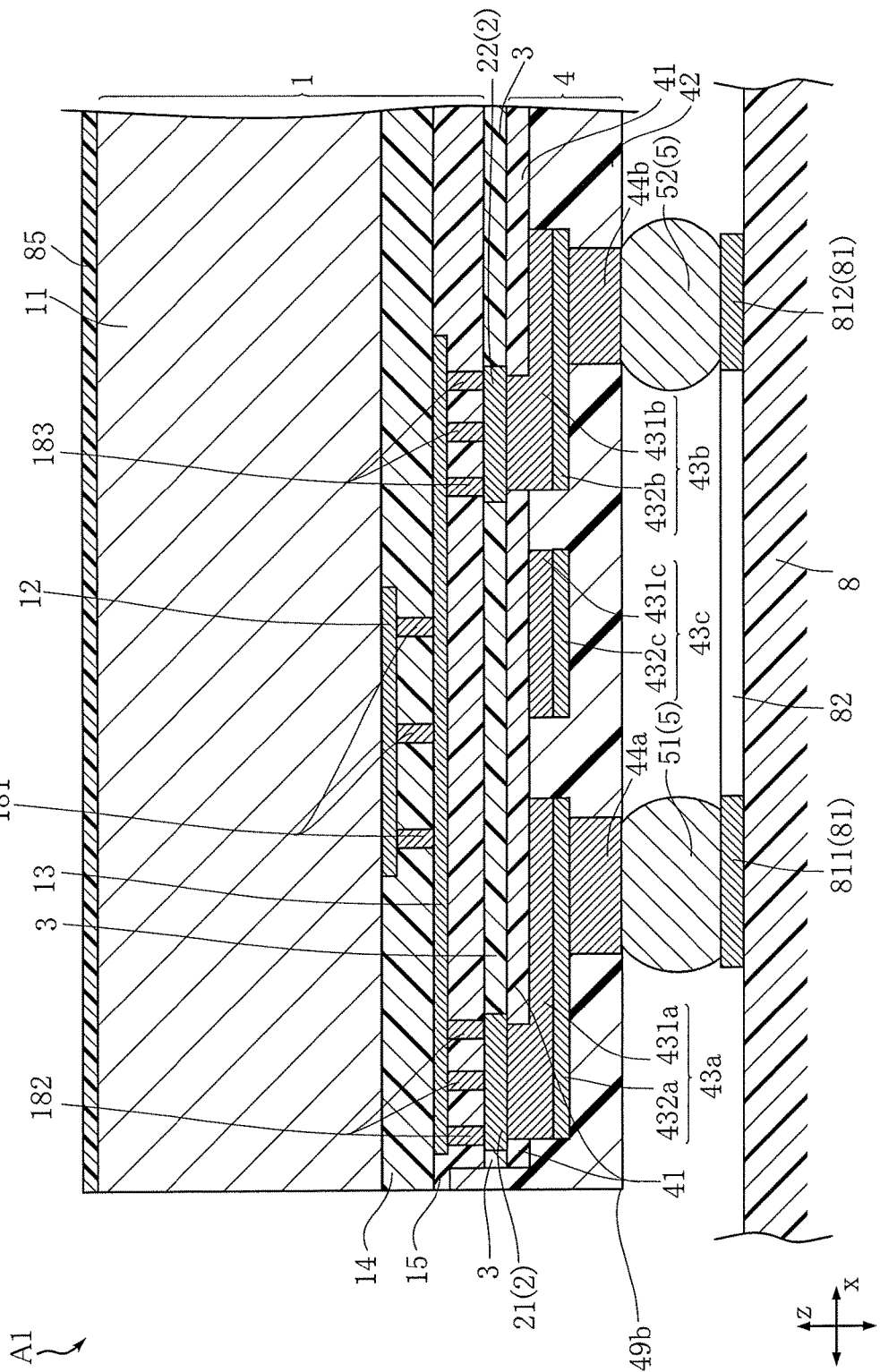

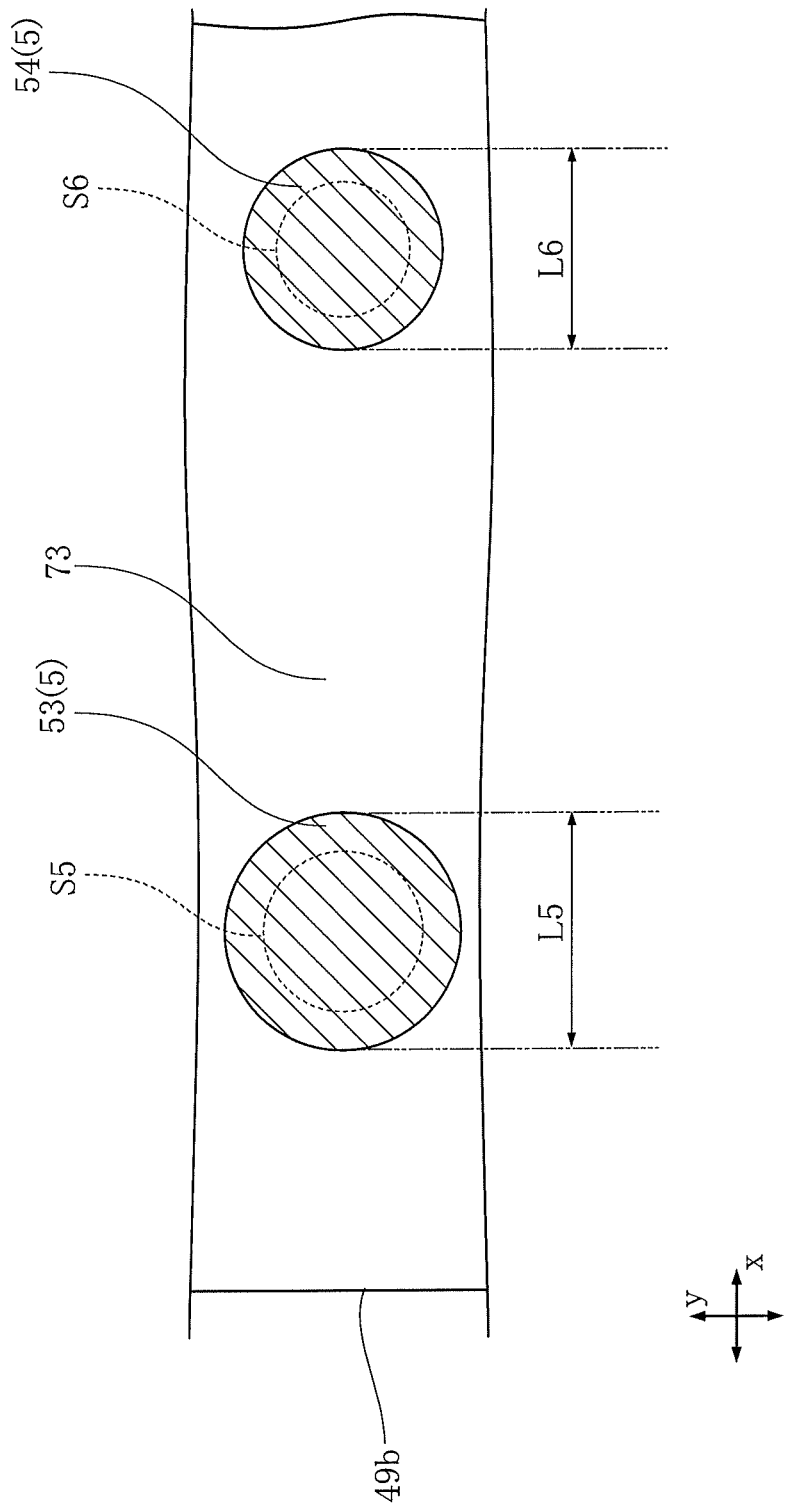

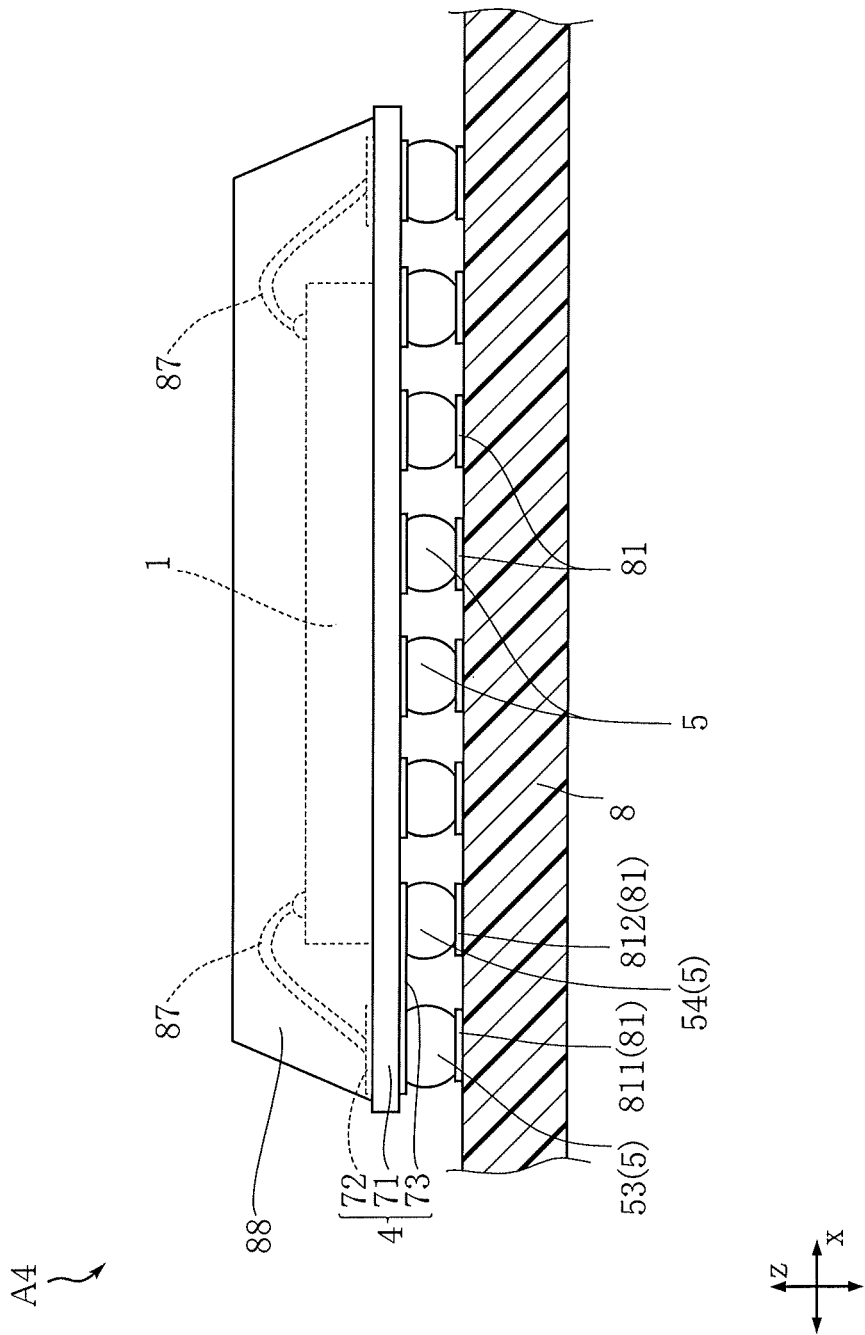

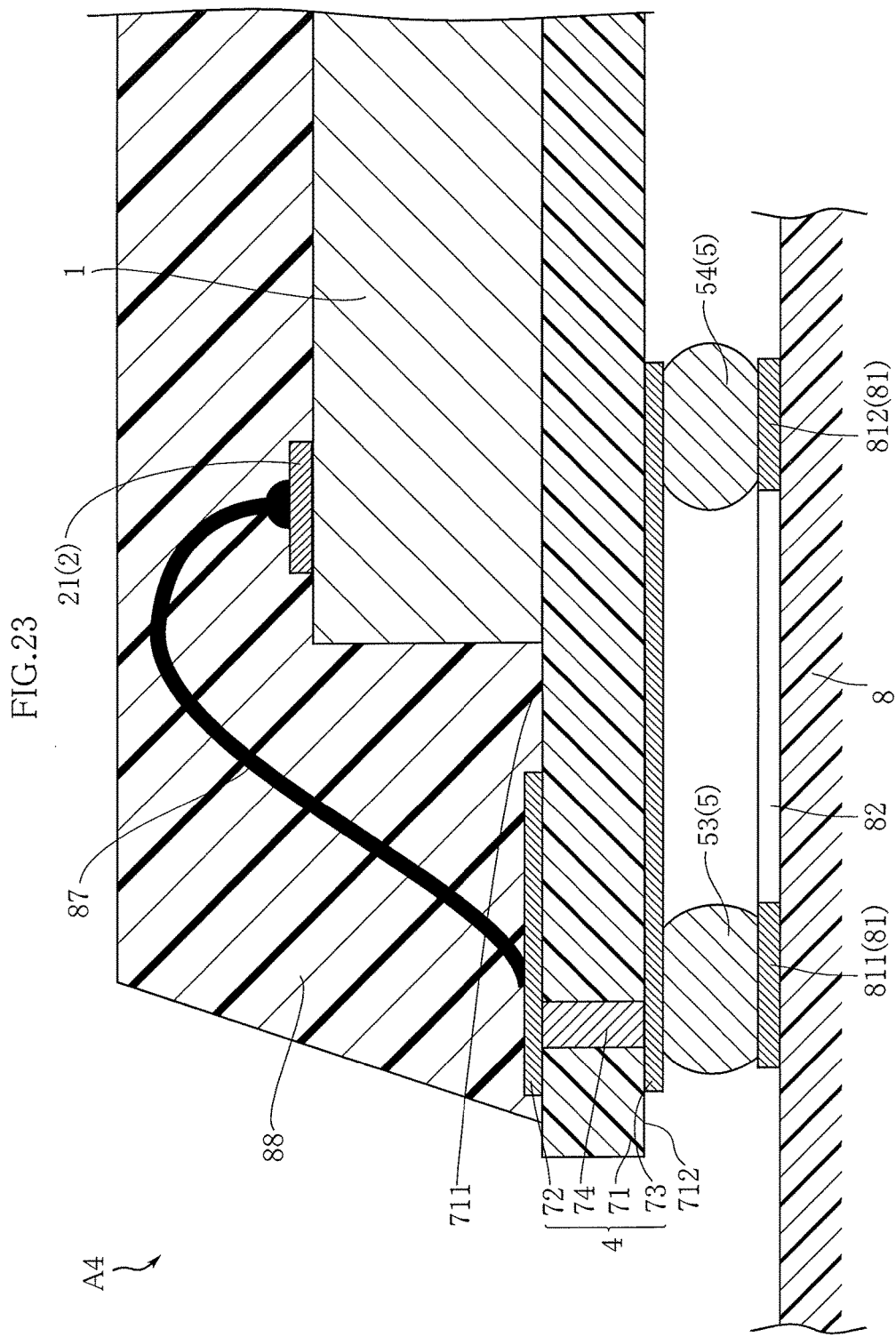

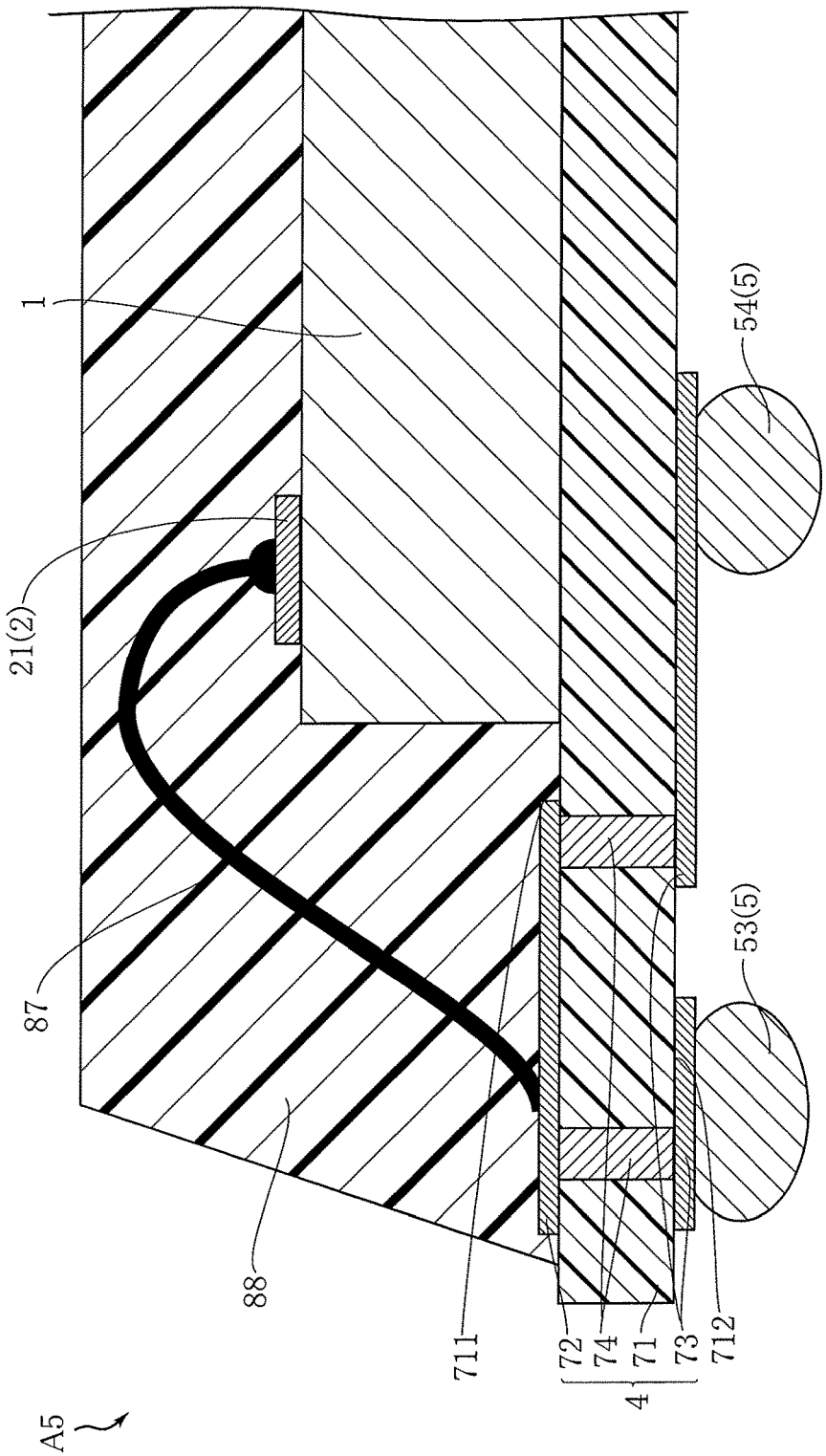

SEMICONDUCTOR DEVICE

TECHNICAL FIELD

The present invention relates to a semiconductor device.

BACKGROUND ART

Semiconductor devices provided with semiconductor chips are conventionally known (see Patent Document 1, for example). A semiconductor device of ball grid types such as a CSP (Chip Size Package) type or a BGA (Ball Grid Array) type has a plurality of bumps. Such a semiconductor device is mounted on a mounting substrate by bonding the bumps onto mounting pads formed on the mounting substrate (electrically and mechanically connected to the mounting substrate).

When such a semiconductor device is mounted on a mounting substrate, stress may be applied to the bumps. The bumps, when receiving stress, break due to fatigue, which blocks electrical conduction between the semiconductor chip and the mounting pads on the mounting substrate. Such a condition may cause a malfunction of the semiconductor device and is not desirable.

Patent Document 1: JP-A-2008-159949

SUMMARY OF THE INVENTION

Problems to be Solved by the Invention

The present invention is conceived in view of the foregoing situation, and it is therefore an object of the present invention to provide a semiconductor device suitable for preventing malfunctions.

Means for Solving the Problems

According to a first aspect of the present invention, there is provided a semiconductor device comprising a semiconductor chip, a first electrode pad laminated on the semiconductor chip an intermediate layer having a rectangular shape defined by a first edge and a second edge, and a plurality of bumps arranged to sandwich the intermediate layer by cooperating with the semiconductor chip. The first edge extends in a first direction crossing the thickness direction of the semiconductor chip, and the second edge extends in a second direction crossing both of the thickness direction and the first direction. The plurality of bumps include a first bump electrically connected to the first electrode pad and a second bump electrically connected to the first electrode pad. The first bump is arranged at one end in the first direction and one end in the second direction.

Preferably, the semiconductor device further comprises a second electrode pad laminated on the semiconductor chip. The semiconductor chip includes a wiring layer for electrically connecting the first electrode pad and the second electrode pad to each other. The second bump is electrically connected to the first electrode pad via the second electrode pad.

Preferably, the semiconductor device further comprises a coating film that exposes the first electrode pad and the second electrode pad. The intermediate layer includes a stress buffer layer laminated on the coating film, a first re-distribution layer laminated on the stress buffer layer and a second re-distribution layer laminated on the stress buffer layer. The first re-distribution layer includes a portion that overlaps the first bump as viewed in the thickness direction, the second re-distribution layer includes a portion that overlaps the second bump as viewed in the thickness direction, and the first re-distribution layer and the second re-distribution layer are spaced apart from each other.

Preferably, the semiconductor device further comprises a coating film that exposes the first electrode pad and the second electrode pad. The intermediate layer includes a stress buffer layer laminated on the coating film and a re-distribution layer laminated on the stress buffer layer. The re-distribution layer electrically connects the first bump and the second bump to each other.

Preferably, the semiconductor device further comprises a coating film that exposes the first electrode pad. The intermediate layer includes a stress buffer layer laminated on the coating film and a re-distribution layer laminated on the stress buffer layer. The re-distribution layer electrically connects the first bump and the second bump to each other.

Preferably, the intermediate layer includes a first post extending in the thickness direction of the semiconductor chip and a second post extending in the thickness direction of the semiconductor chip. The first post is in contact with the first bump, whereas the second post is in contact with the second bump.

Preferably, the bonding area between the first post and the first bump is larger than the bonding area between the second post and the second bump.

Preferably, the cross section of the first post within a plane spreading in the first direction and the second direction is larger than the cross section of the second post within a plane spreading in the first direction and the second direction.

Preferably, the first post is in the form of a round column having a diameter of a first dimension and elongated in the thickness direction, and the second post is in the form of a round column having a diameter of a second dimension smaller than the first dimension and elongated in the thickness direction.

Preferably, the first dimension is 1.1 to 1.5 times the second dimension.

Preferably, the intermediate layer includes a substrate including an obverse surface and a reverse surface, an obverse surface wiring layer formed on the obverse surface, and a reverse surface wiring layer formed on the reverse surface. The reverse surface faces away from the obverse surface. The semiconductor chip is mounted on the obverse surface. The reverse surface wiring layer is electrically connected to the obverse surface wiring layer. The reverse surface wiring layer is in contact with both of the first bump and the second bump.

Preferably, the first bump and the second bump are equal in volume.

Preferably, the plurality of bumps comprise at least twenty-five bumps.

Preferably, the first bump has a circular shape having a diameter of a first length as viewed in the thickness direction, and the second bump has a circular shape having a diameter of a second length smaller than the first length as viewed in the thickness direction.

Preferably, the first length is 1.1 to 1.5 times the second length.

Preferably, the second bump is closest to the first bump among the plurality of bumps.

Preferably, both of the first bump and the second bump are functional pins.

Preferably, the plurality of bumps comprise bumps arranged as the first bump at four corners.

Other features and advantages of the present invention will become more apparent from the detailed description given below with reference to the accompanying drawings.

BRIEF DESCRIPTION OF THE DRAWINGS

FIG. 3B is a schematic sectional view taken along lines IIIB-IIIB in FIG. 2; FIG. 4 is a side view of the semiconductor device according to the first embodiment of the present invention mounted on a mounting substrate;

FIG. 5 is a schematic sectional view of the semiconductor device according to the first embodiment of the present invention mounted on a mounting substrate;

FIG. 21 is a schematic sectional view taken along lines XXI-XXI in FIG. 20;

FIG. 22 is a side view of the semiconductor device according to the fourth embodiment of the present invention mounted on a mounting substrate;

FIG. 23 is a schematic sectional view of the semiconductor device according to the fourth embodiment of the present invention mounted on a mounting substrate; and FIG. 24 is a schematic sectional view of a semiconductor device according to a fifth embodiment of the present invention.

MODE FOR CARRYING OUT THE INVENTION

Preferred embodiments of the present invention are described below with reference to the accompanying drawings.

Figure 1A:
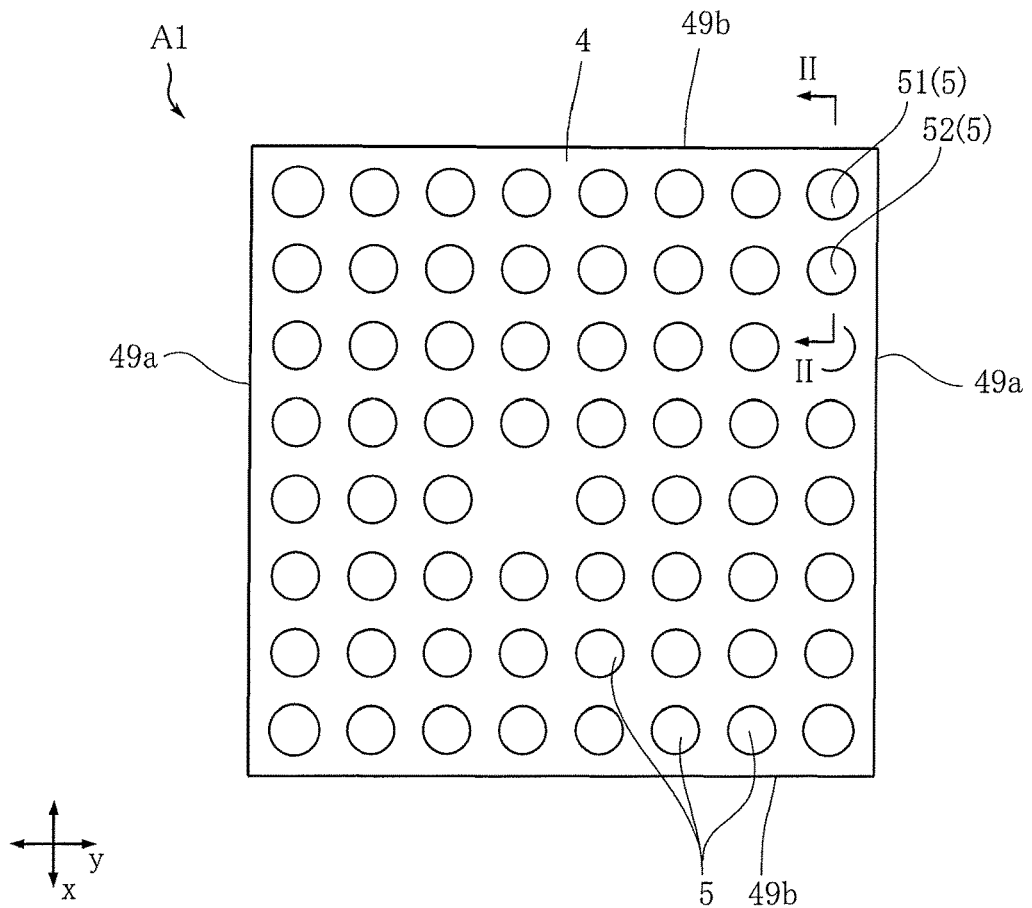
FIG. 1A is a bottom view of a semiconductor device according to a first embodiment of the present invention.
Figure 1B:
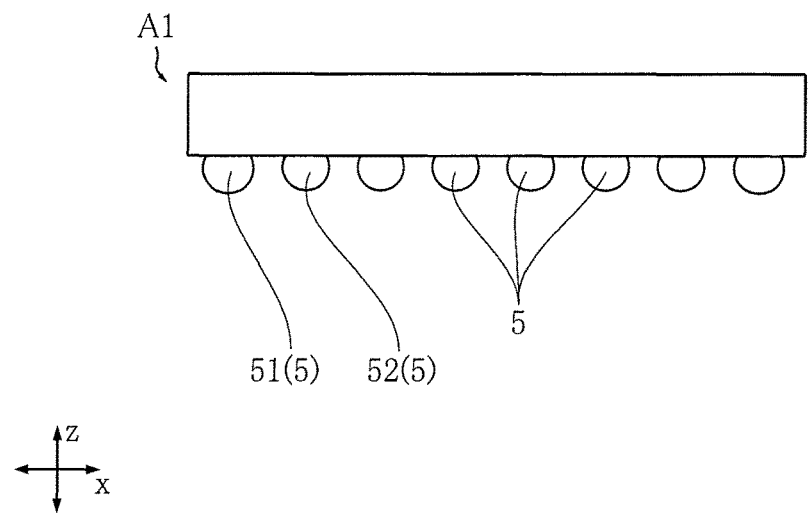
FIG. 1B is a side view of the semiconductor device according to the first embodiment of the present invention.
Figure 2:
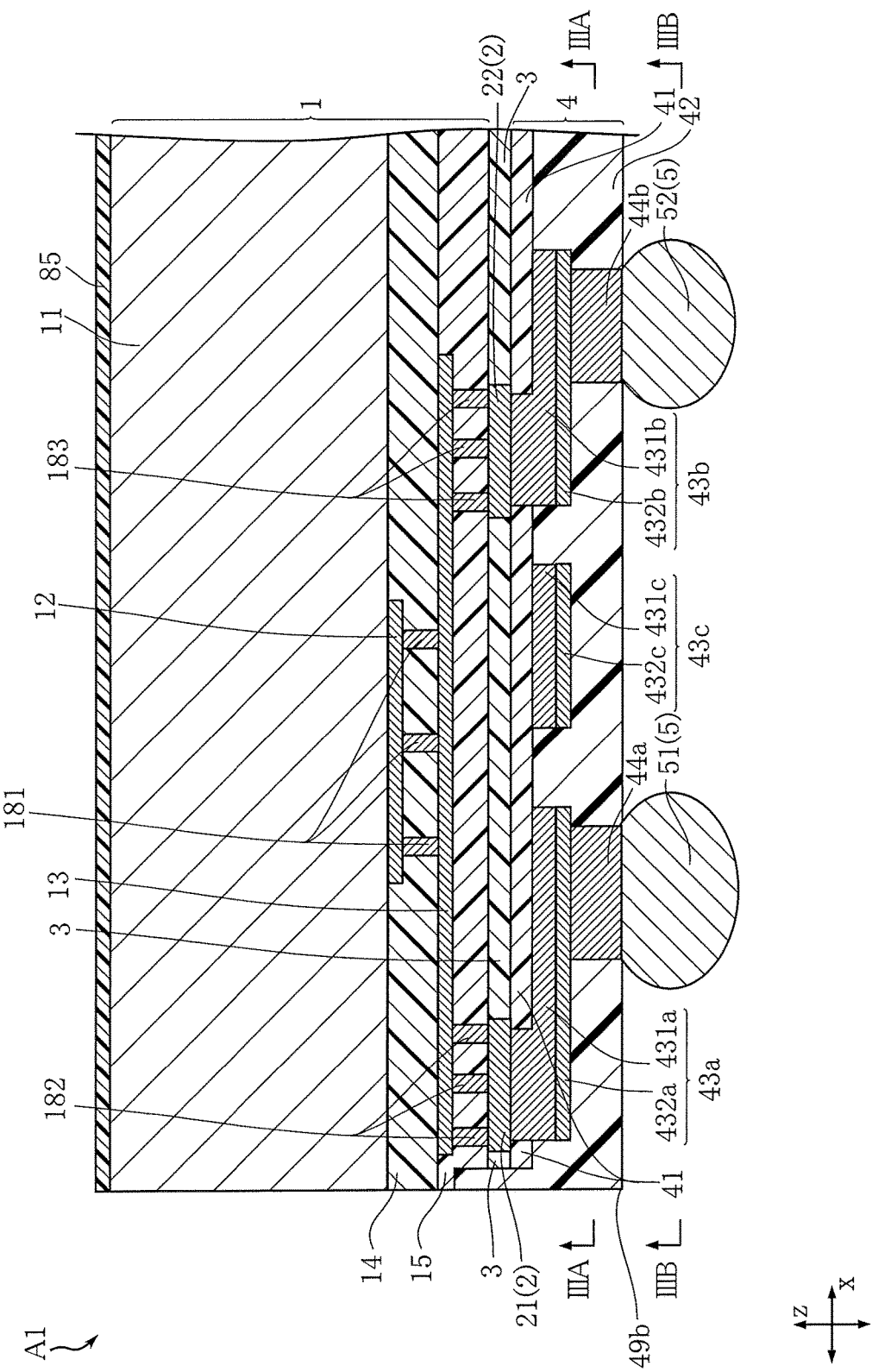
FIG. 2 is a schematic sectional view taken along lines II-II in FIG. 1A.
Figure 3A:
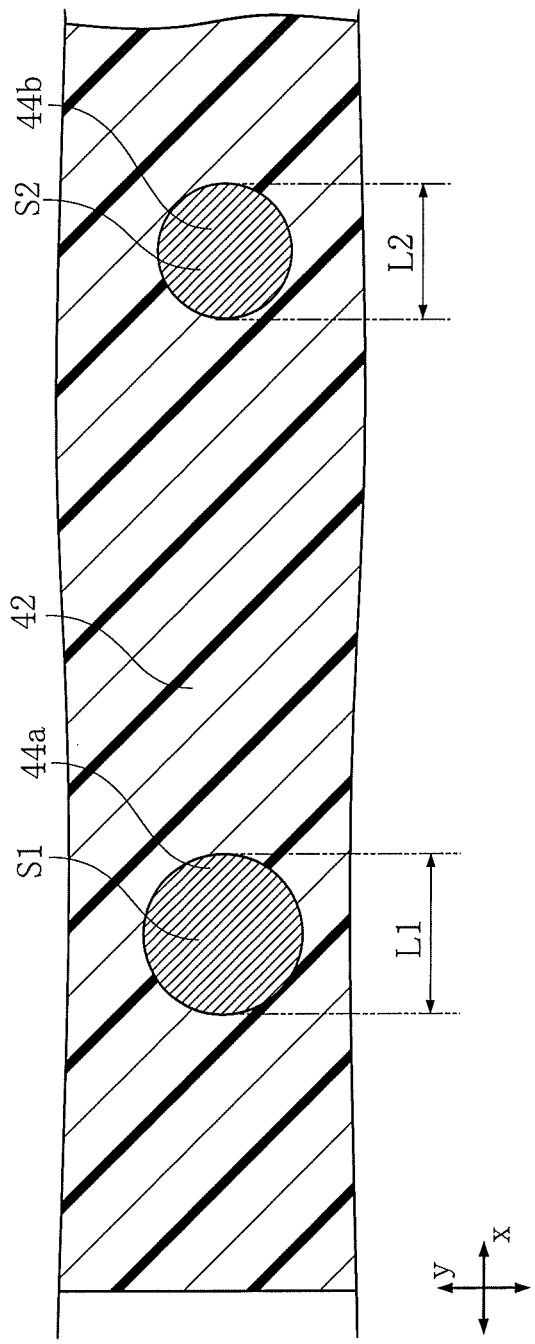
FIG. 3A is a schematic sectional view taken along lines IIIA-IIIA in FIG. 2.

A first embodiment of the present invention is described below with reference to FIGS. 1A-16. FIG. 1A is a bottom view of a semiconductor device of this embodiment. FIG. 1B is a side view of the semiconductor device of the embodiment. FIG. 2 is a schematic sectional view taken along II-II in FIG. 1. FIG. 3A is a schematic sectional view taken along lines IIIA-IIIA in FIG. 2. FIG. 3B is a schematic sectional view taken along lines IIIB-IIIB in FIG. 2.

The semiconductor device A1 shown in these figures includes a semiconductor chip 1, a plurality of electrode pads 2, a coating film 3, an intermediate layer 4, a plurality of bumps 5 and a resin coat 85. The semiconductor device A1 is a device to which the CSP (Chip Size Package) technique is applied.

The semiconductor chip 1 is an LSI chip and has a multi-layer wiring structure. The semiconductor chip 1 includes a semiconductor substrate 11, wiring layers 12 and 13, insulating layers 14 and 15, and a plurality of through vias 181,182, 183.

The semiconductor substrate 11 is made of a semiconductor material such as silicon. The semiconductor substrate 11 is formed with an integrated circuit such as a logic circuit. The integrated circuit includes a plurality of terminals, not shown. The semiconductor substrate 11 is covered with a resin coat 85 made of an insulating resin.

Each of the wiring layers 12 and 13 is made of a conductive material such as copper and aluminum. Each of the wiring layers 12 and 13 has a predetermined pattern shape. The thickness (dimension in the direction z) of each wiring layer 12, 13 is e.g. 0.5-3.0 μm. Each of the insulating layers 14 and 15 is made of an insulating material such as silicon oxide and silicon nitride. The thickness (dimension in the direction z) of each insulating layer 14, 15 is e.g. 1.0-3.0 μm.

The wiring layer 12 is laminated on the semiconductor substrate 11. The insulating layer 14 is laminated on the semiconductor substrate 11 and covers the wiring layer 12. The wiring layer 13 is laminated on the insulating layer 14. The insulating layer 15 is laminated on the insulating layer 14. The insulating layer 15 covers the wiring layer 13.

Through vias 181, 182 and 183 are made of a conductive material such as copper and aluminum. Through vias 181 penetrate the insulating layer 14. The through vias 181 are in contact with the wiring layer 12 and the wiring layer 13, whereby the wiring layer 12 and the wiring layer 13 are electrically connected to each other. Through vias 182 and 183 penetrate the insulating layer 15. The through vias 182 are in contact with the wiring layer 13 and the first electrode pad 21, which will be described later, whereby the wiring layer 13 and the first electrode pad 21 are electrically connected to each other. The through vias 183 are in contact with the wiring layer 13 and the second electrode pad 22, which will be described later, whereby the wiring layer 13 and the second electrode pad 22 are electrically connected to each other.

The electrode pads 2 are provided on the semiconductor chip 1 (of the electrode pads 2, only the first electrode pad 21 and the second electrode pad 22 are shown). Specifically, the electrode pads 2 are provided on the insulating layer 15. The electrode pads 2 are electrically connected to the terminals of the above-described integrated circuit formed in the semiconductor substrate 11. The electrode pads 2 are arranged at different positions from each other as viewed in the direction z. The electrode pads 2 are made of e.g. aluminum. The thickness (dimension in the direction z) of each electrode pad 2 is e.g. 0.5-3.0 μm.

The coating film 3 is laminated on the insulating layer 15. The coating film 3 is made of an insulating material such as silicon oxide and silicon nitride. The thickness (dimension in the direction z) of the coating film 3 is e.g. 0.5-2.0 μm. The electrode pads 2 are exposed from the coating film 3.

The intermediate layer 4 is laminated on the semiconductor chip 1 via the coating film 3. The intermediate layer 4 includes a stress buffer layer 41, a resin layer 42, re-distribution layers 43a, 43b, 43c, and a plurality of posts 44a, 44b. As shown in FIG. 1A, as viewed in the direction z, the intermediate layer 4 is in the form of a rectangle defined by first edges 49a extending in the direction x and second edges 49b extending in the direction y. The side surfaces of the intermediate layer 4 are flush with the side surfaces of the semiconductor chip 1. Thus, the semiconductor device A1 is generally in the form of a parallelepiped having the same size as that of the semiconductor chip 1 as viewed in the direction z.

The stress buffer layer 41 is laminated on the coating film 3. The stress buffer layer 41 is made of an insulating material such as polyimide. The thickness (dimension in the direction z) of the stress buffer layer 41 is e.g. 8 μm. When stress is applied to the semiconductor device A1, the stress buffer layer 41 serves to absorb and alleviate the stress.

The resin layer 42 is laminated on the stress buffer layer 41. The resin layer 42 is made of an insulating resin such as an epoxy resin. The thickness of the resin layer 42 (dimension in the direction z) is e.g. 90 μm.

The re-distribution layer 43a includes a base layer 431a and a metal layer 432a. The re-distribution layer 43a has a portion overlapping the first bump 51, which will be described later, as viewed in the direction z. Part of the base layer 431a penetrates the stress buffer layer 41. Part of the base layer 431a is laminated on the stress buffer layer 41. The base layer 431a is in contact with the first electrode pad 21. The base layer 431a prevents the first electrode pad 21 from corroding. The base layer 431a is made of a metal such as titanium, nickel, and titanium tungsten. The metal layer 432a is laminated on the base layer 431a. The metal layer 432a is made of a metal such as copper.

The post 44a is arranged vertically on the re-distribution layer 43a. The post 44a functions to alleviate the stress applied to the first bump 51. The post 44a is in contact with the re-distribution layer 43a. The cross section S1 of the post 44a within a plane spreading in the direction x and the direction y shown in FIG. 3A is e.g. 17671-196350 μm². In this embodiment, the post 44a is in the form of a round column having a diameter L1 and extending in the direction z. The diameter L1 is e.g. 150-500 μm. Alternatively, the post 44a may be in the form of a rectangular prism. The post 44a is made of e.g. copper.

Similarly to the re-distribution layer 43a, the re-distribution layer 43b includes a base layer 431b and a metal layer 432b. The re-distribution layer 43b has a portion overlapping the second bump 52, which will be described later, as viewed in the direction z. The re-distribution layer 43b is spaced apart from the re-distribution layer 43a. Part of the base layer 431b penetrates the stress buffer layer 41. Part of the base layer 431b is laminated on the stress buffer layer 41. The base layer 431b is in contact with the second electrode pad 22. The base layer 431b prevents the second electrode pad 22 from corroding. The base layer 431b is made of a metal such as titanium, nickel, and titanium tungsten. The metal layer 432b is laminated on the base layer 431b. The metal layer 432b is made of a metal such as copper.

The post 44b is arranged vertically on the re-distribution layer 43b. The post 44b functions to alleviate the stress applied to the second bump 52. The post 44b is in contact with the re-distribution layer 43b. It is preferable that the cross section S2 of the post 44b within a plane spreading in the direction x and the direction y shown in FIG. 3A is smaller than the cross section S1 of the post 44a (i.e., the cross section S1 is larger than the cross section S2). The cross section S2 is e.g. 7854-125664 μm². In this embodiment, the post 44b is in the form of a round column having a diameter L2 and extending in the direction z. It is preferable that the diameter L1 is larger than the diameter L2. Preferably, for example, the diameter L1 is 1.1-1.5 times the diameter L2. For example, the diameter L2 is 100-400 μm. The post 44b is made of e.g. copper.

Similarly to the re-distribution layers 43a and 43b, the re-distribution layer 43c includes a base layer 431c and a metal layer 432c. As shown in FIG. 2, the re-distribution layer 43c is positioned between the re-distribution layer 43a and the re-distribution layer 43b. The re-distribution layer 43c is insulated from the re-distribution layers 43a, 43b. Part of the base layer 431c penetrates the stress buffer layer 41 at a location not shown in the drawings. As shown in FIG. 2, part of the base layer 431c is laminated on the stress buffer layer 41. The base layer 431c is in contact with the electrode pad 2, not shown. The base layer 431c is made of a metal such as titanium, nickel, and titanium tungsten. The metal layer 432c is laminated on the base layer 431c. The metal layer 432c is made of a metal such as copper.

As shown in FIG. 2, the plurality of bumps 5 are positioned opposite the semiconductor chip 1 across the intermediate layer 4. That is, the intermediate layer 4 is sandwiched between the bumps 5 and the semiconductor chip 1. As shown in FIG. 1A, in this embodiment, as viewed in the direction z, the plurality of bumps 5 are arranged in a matrix. Each bump 5 is generally spherical and made of e.g. solder. In this embodiment, the bumps 5 are equal to each other in volume. For instance, the volume of each bump 5 is $1407 \times 10^3$-$10390 \times 10^3$ μm³. It is preferable that at least five bumps are arranged in the direction x and at least five bumps are arranged in the direction y so that at least twenty-five bumps in total are provided.

As shown in FIGS. 1A-3B, the bumps 5 include a first bump 51 and a second bump 52. Both of the first bump 51 and the second bump 52 are functional pins. As shown in FIG. 1A, the first bump 51 is arranged at one end in the direction x and one end in the direction y. As shown in FIG. 2, the first bump 51 is bonded to the post 44a. The bonding area S3 (see FIG. 3B) between the first bump 51 and the post 44a is e.g. 17671-196350 μm². As viewed in the direction z, the first bump 51 has a circular shape having a diameter L3 (see FIG. 3B). The diameter L3 is e.g. 150-550 μm. The first bump 51 is electrically connected to the wiring layer 13 via the post 44a, the re-distribution layer 43a, the first electrode pad 21 and the through via 182.

The second bump 52 is bonded to the post 44b. In this embodiment, one of the plurality of bumps 5 which is adjacent to the first bump 51 is the second bump 52. However, the second bump 52 is not limited to the one adjacent to the first bump 51 and may be the one provided at the center of the plurality of bumps 5. It is preferable that the above-described bonding area S3 is larger than the bonding area S4 between the second bump 52 and the post 44b. The bonding area S4 is e.g. 7854-125664 µm². As viewed in the direction z, the second bump 52 has a circular shape having a diameter L4 (FIG. 3B). It is preferable that the diameter L3 is larger than the diameter L4. Preferably, the diameter L3 is 1.1-1.5 times the diameter L4. For example, the diameter L4 is 100-460 µm. The second bump 52 is electrically connected to the wiring layer 13 via the post 44b, the re-distribution layer 43b, the second electrode pad 22 and the through via 183. In this embodiment, the wiring layer 13 electrically connects the first bump 51 and the second bump 52 to each other.

Though not illustrated in the figure, one of the bumps 5 other than first bump 51 and the second bump 52 is electrically connected to the re-distribution layer 43c.

FIGS. 4 and 5 show the state in which the semiconductor device A1 is mounted on a mounting substrate 8. In mounting the semiconductor device A1 on the mounting substrate 8, the bumps 5 are bonded to the mounting pads 81 of the mounting substrate 8. Thus, the terminals (not shown) of the integrated circuit formed in the semiconductor substrate 11 are electrically connected to the mounting pads 81. Of the plurality of mounting pads 81, the mounting pad 811 to which the first bump 51 is bonded and the mounting pad 812 to which the second bump 52 is bonded are electrically connected to each other via the wiring 82 (not shown in FIG. 4) on the mounting substrate 8. Thus, the wiring layers 12, 13, the through vias 181-183, the first electrode pad 21, 22, the re-distribution layers 43a, 43b, the posts 44a, 44b, the first bump 51, the second bump 52, the mounting pads 811, 812 and the wiring 82 are electrically connected to each other.

All the bumps 5 positioned at the four corners may be configured to have the same structure as that of the first bump 51.

The advantages of the semiconductor device A1 are described below.

In the semiconductor device A1, as shown in FIG. 1A, the first bump 51 is arranged at one end in the direction x and one end in the direction y. In the state in which the semiconductor device A1 is mounted on the mounting substrate 8, out of the plurality of bumps 5, stress is easily applied to the first bump 51, so that the first bump 51 is likely to break due to fatigue. When the first bump 51 is broken due to fatigue, the current flow path from the first electrode pad 21 to the mounting pad 811 through the first bump 51 is interrupted.

In the semiconductor device A1, the first electrode pad 21 is electrically connected to the mounting pad 811 through the second bump 52. Thus, even when the current flow path from the first electrode pad 21 to the mounting pad 811 through the first bump 51 is interrupted, the first electrode pad 21 can be electrically connected to the mounting pad 811 through the second bump 52. Thus, the semiconductor device A1 prevents malfunction due to the interruption of the current path from the first electrode pad 21 to the mounting pad 811 through the first bump 51.

In the semiconductor device A1, the bonding area S3 (see FIG. 3B) between the post 44a and the first bump 51 is larger than the bonding area S4 (see FIG. 3B) between the post 44b and the second bump 52. This structure reduces the stress applied to the first bump 51. Thus, the semiconductor device A1 is suitable for preventing the breakage of the first bump 51 due to fatigue and hence preventing the above-described malfunction.

In the semiconductor device A1, as shown in FIG. 3A, the cross section S1 is larger than the cross section S2. This arrangement also helps reducing the stress applied to the first bump 51. Further, this arrangement is suitable for reducing the resistance of the post 44a.

The semiconductor device A1 includes the second electrode pad 22 laminated on the semiconductor chip 1 and electrically connected to the second bump 52. Further, the wiring layer 13 electrically connects the first electrode pad 21 and the second electrode pad 22 to each other. In the semiconductor device A1, even when the re-distribution layer 43a and the re-distribution layer 43b are separated from each other, the first electrode pad 21 can be electrically connected to the second bump 52 via the wiring layer 13 and the second electrode pad 22. Thus, even when the re-distribution layer 43c insulated from both of the re-distribution layers 43a and 43b needs to be provided between the re-distribution layer 43a and the re-distribution layer 43b, the first electrode pad 21 can be electrically connected to the second bump 52.

A method for making the semiconductor device A1 is described below with reference to FIGS. 6-16.

Figure 6:
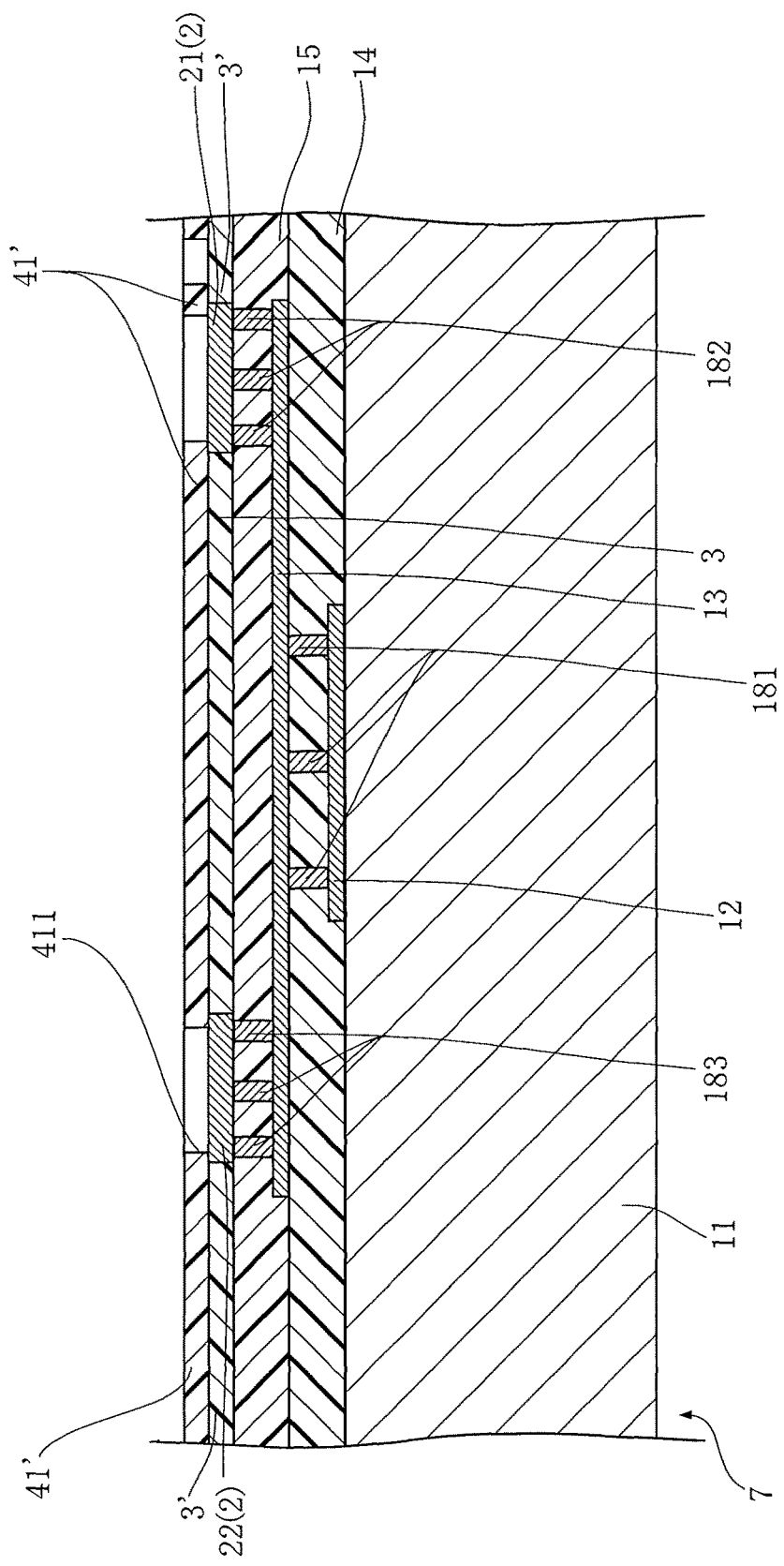
FIG. 6 is a schematic sectional view showing a step in the process of making the semiconductor device according to the first embodiment of the present invention.

First, as shown in FIG. 6, a substrate 7 incorporating a plurality of semiconductor chips is prepared. The substrate 7 has on it a plurality of electrode pads 2 (only the first electrode pad 21 and the second electrode pad 22 are shown in the figure). Almost the entire region of the obverse surface of the substrate 7 is covered with a coating film 3'. The electrode pads 2 are exposed from the coating film 3'. Then, as shown in this figure, a stress buffer layer 41' is formed on the coating film 3'. The stress buffer layer 41' has openings 411 to expose the electrode pads 2.

Figure 7:
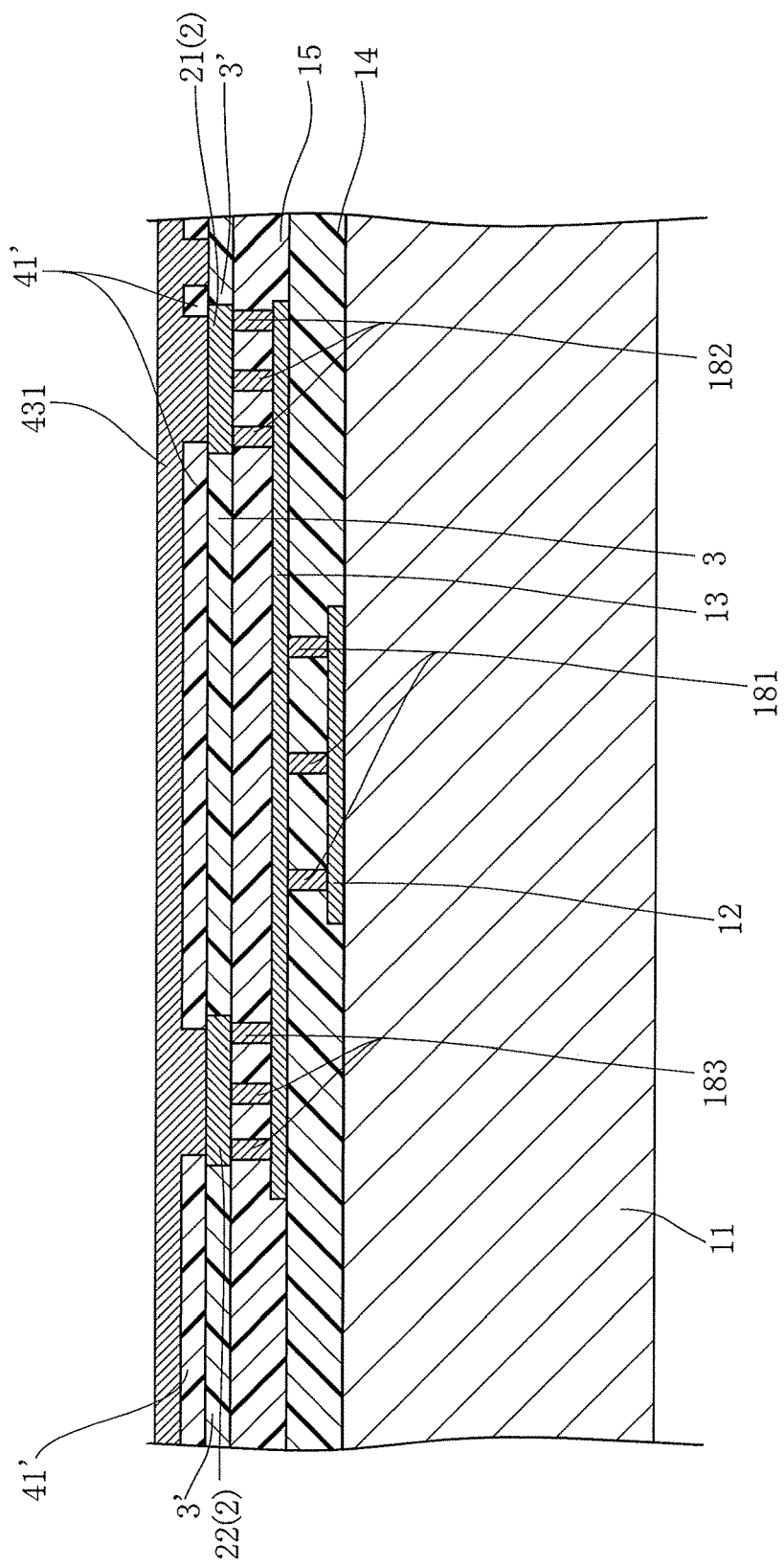
FIG. 7 is a schematic sectional view showing a step in the process of making the semiconductor device according to the first embodiment of the present invention.
Figure 8:
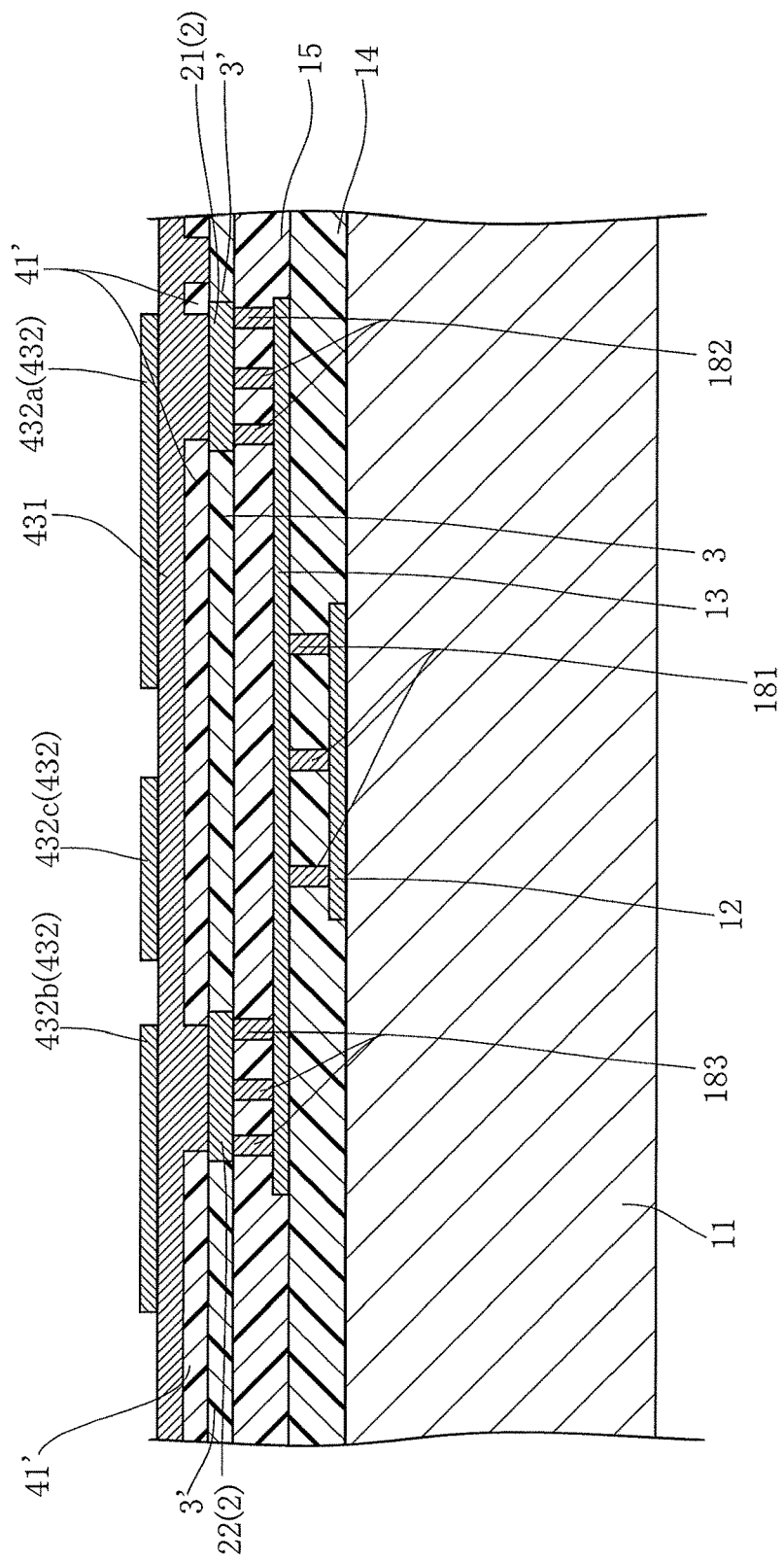
FIG. 8 is a schematic sectional view showing a step in the process of making the semiconductor device according to the first embodiment of the present invention.

Then, as shown in FIG. 7, a base layer 431 is formed to cover the electrode pads 2 and the stress buffer layer 41'. Then, as shown in FIG. 8, a metal layer 432 (including metal layers 432a, 432b, 432c) is formed. Specifically, the metal layer 432 is formed by forming a resist pattern, not shown, on the base layer 431 and then plating the base layer 431.

Figure 9:
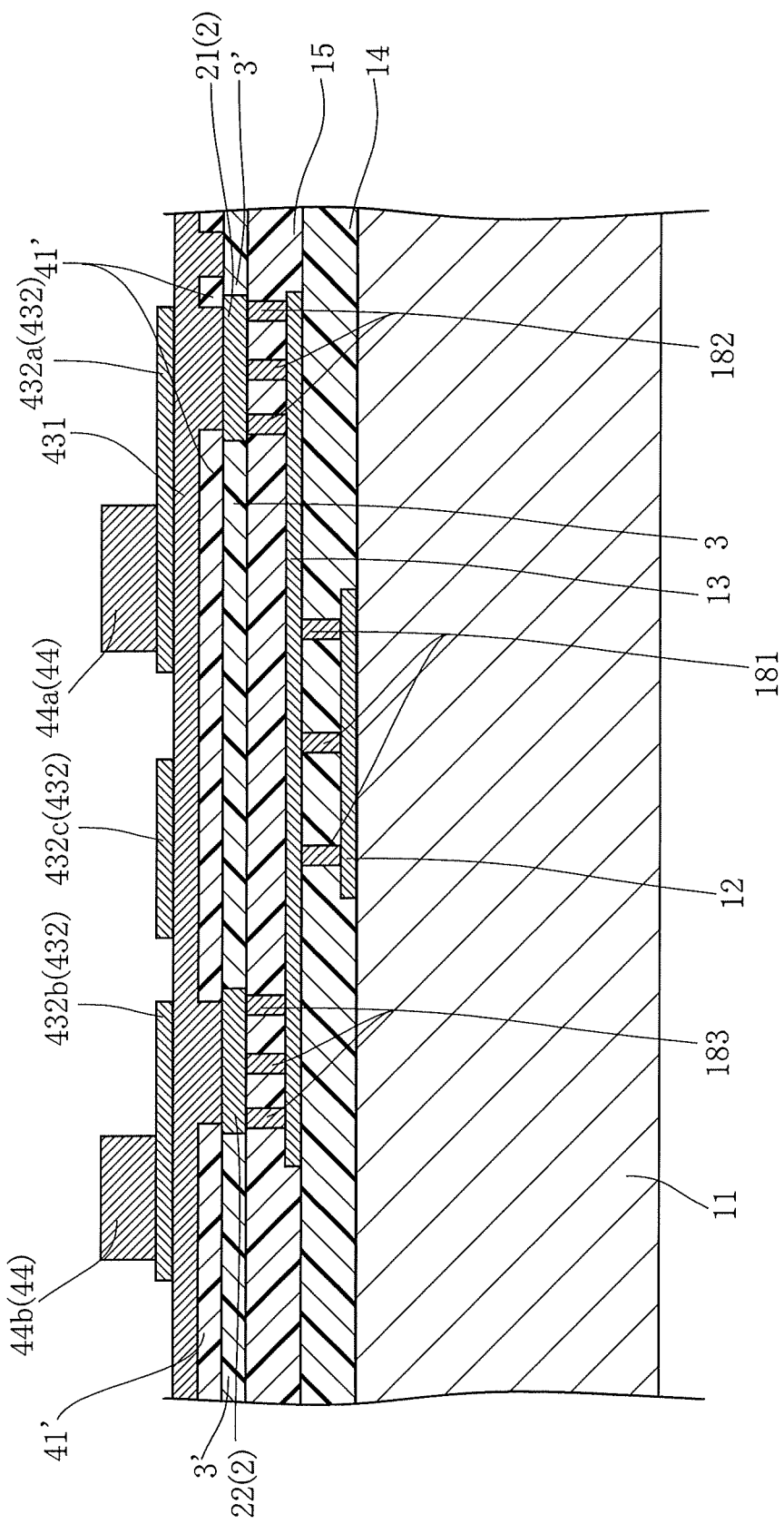
FIG. 9 is a schematic sectional view showing a step in the process of making the semiconductor device according to the first embodiment of the present invention.

Then, as shown in FIG. 9, posts 44 (only the posts 44a and 44b are shown in the figure) are formed. Specifically, the posts 44 are formed by patterning a dry film to cover part of the metal layer 432 and the stress buffer layer 41', and then plating the metal layer 432.

Figure 10:
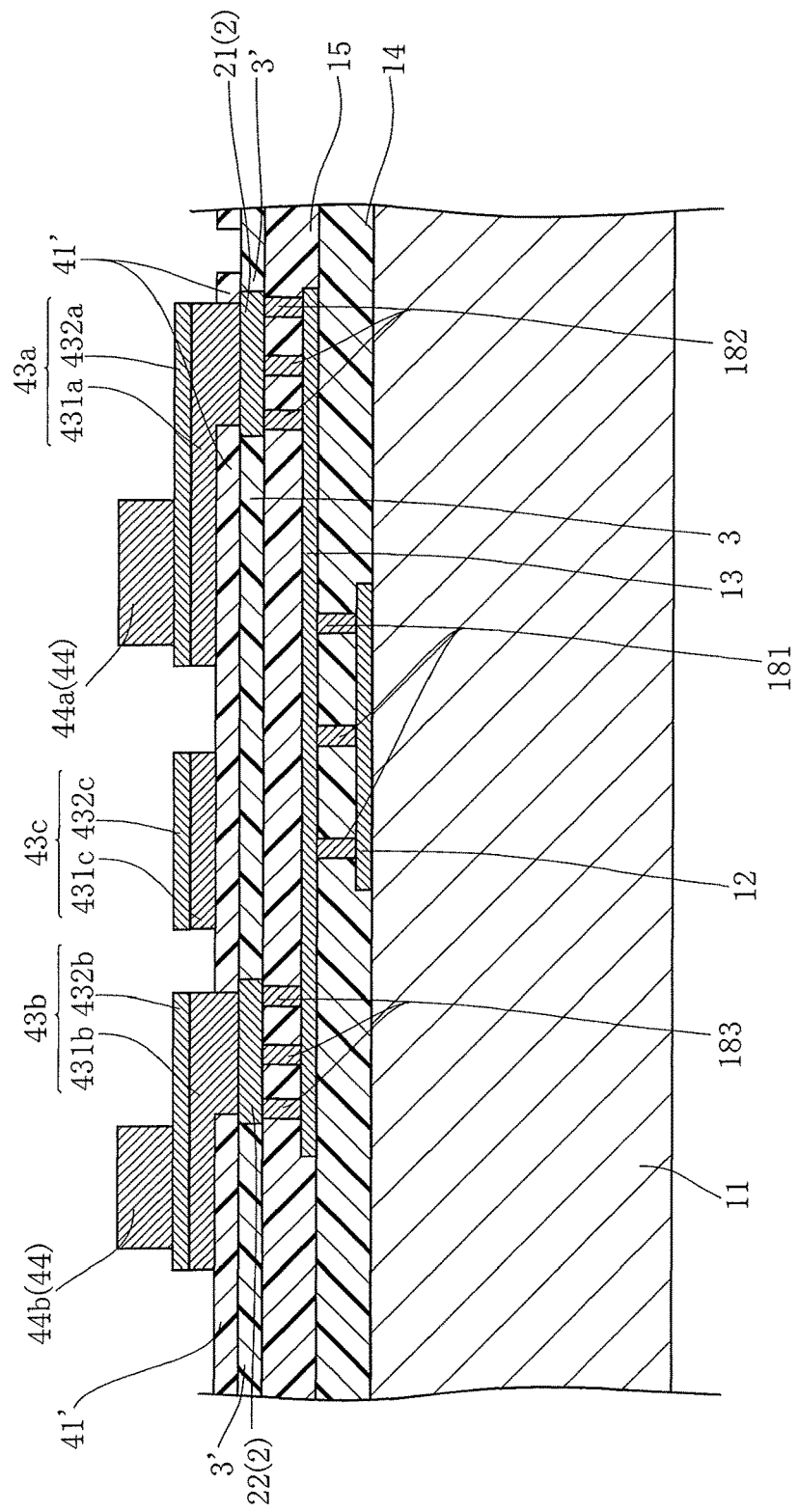
FIG. 10 is a schematic sectional view showing a step in the process of making the semiconductor device according to the first embodiment of the present invention.
Figure 11:
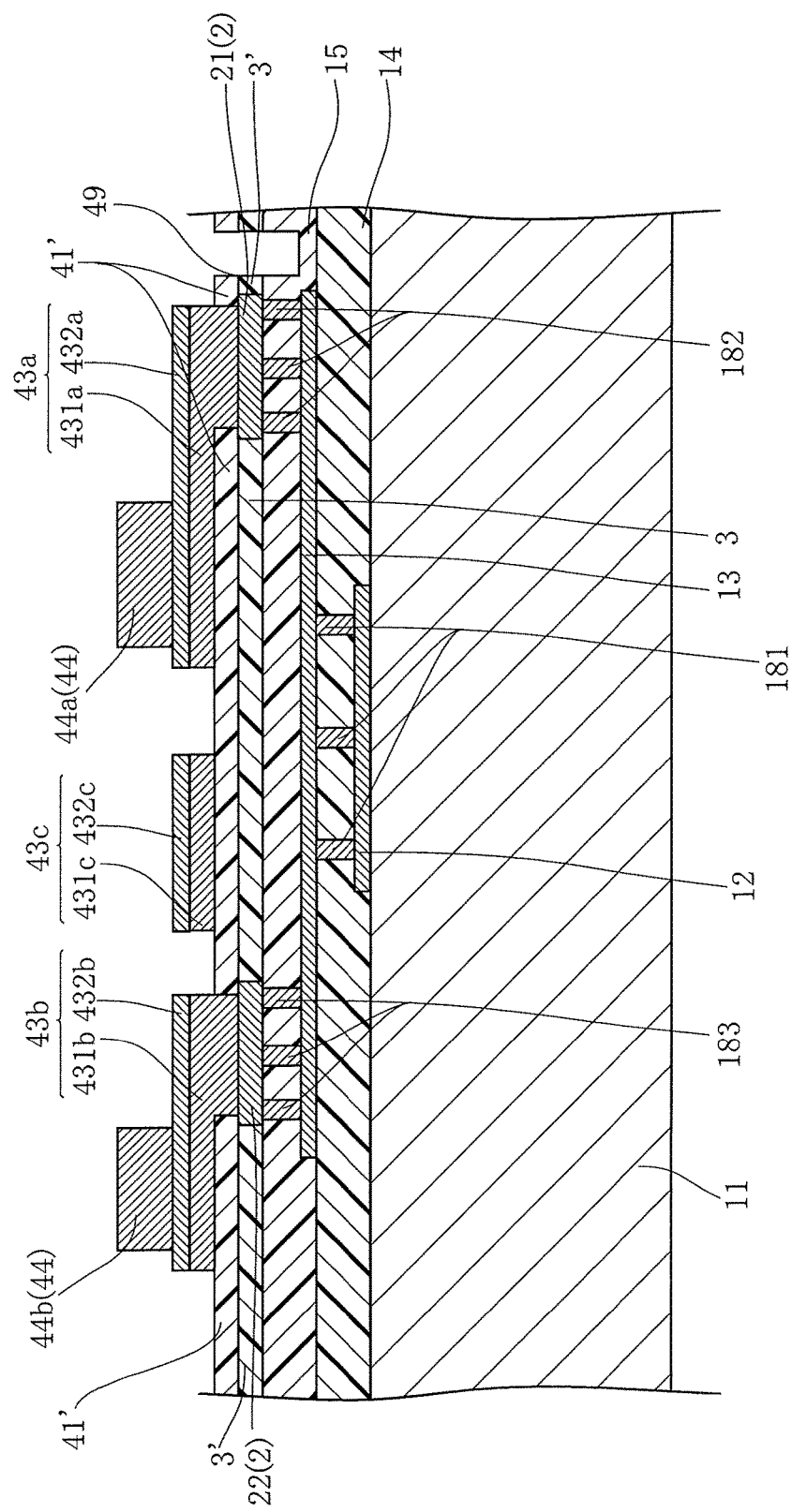
FIG. 11 is a schematic sectional view showing a step in the process of making the semiconductor device according to the first embodiment of the present invention.
Figure 12:
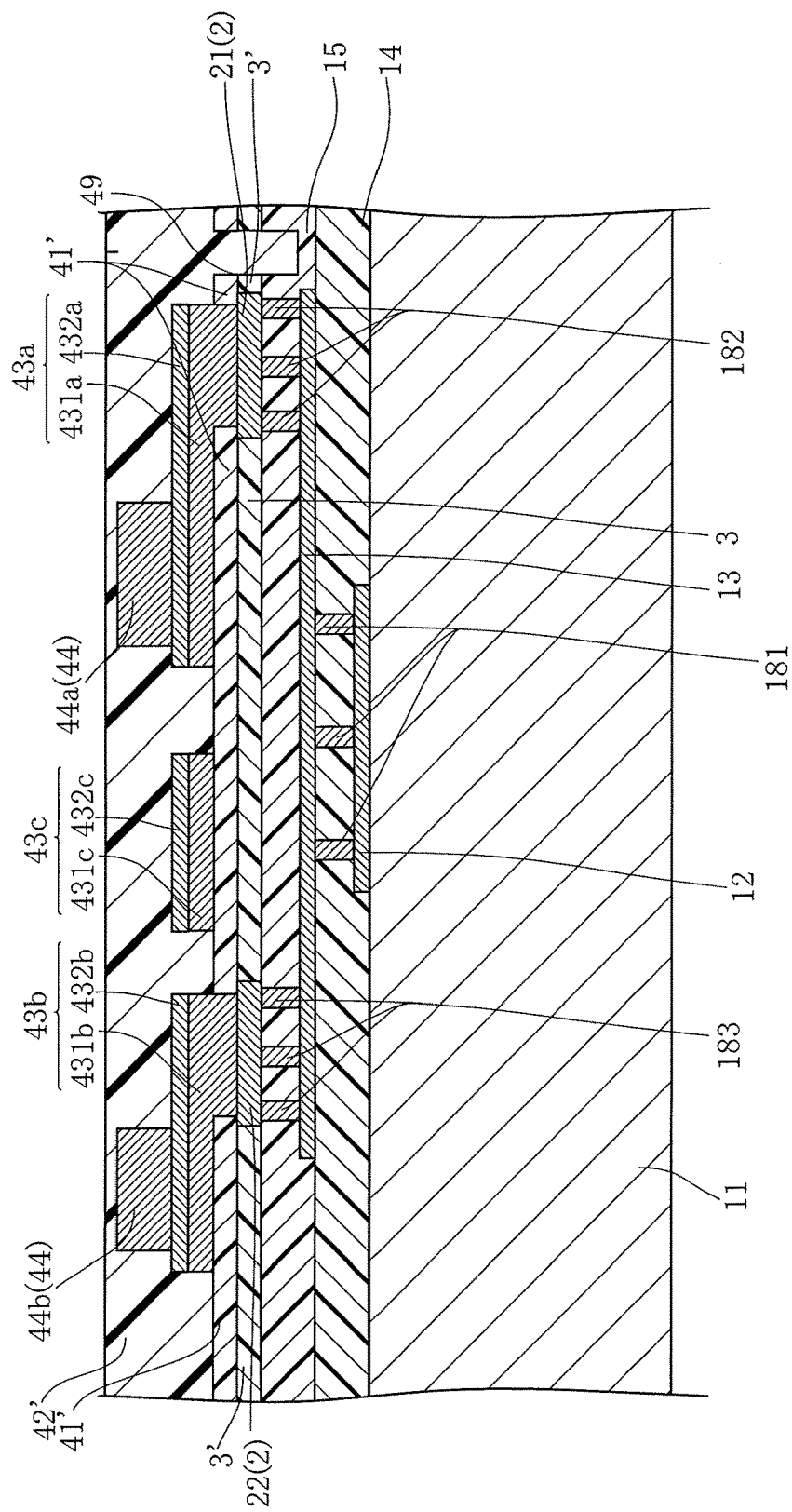
FIG. 12 is a schematic sectional view showing a step in the process of making the semiconductor device according to the first embodiment of the present invention.
Figure 13:
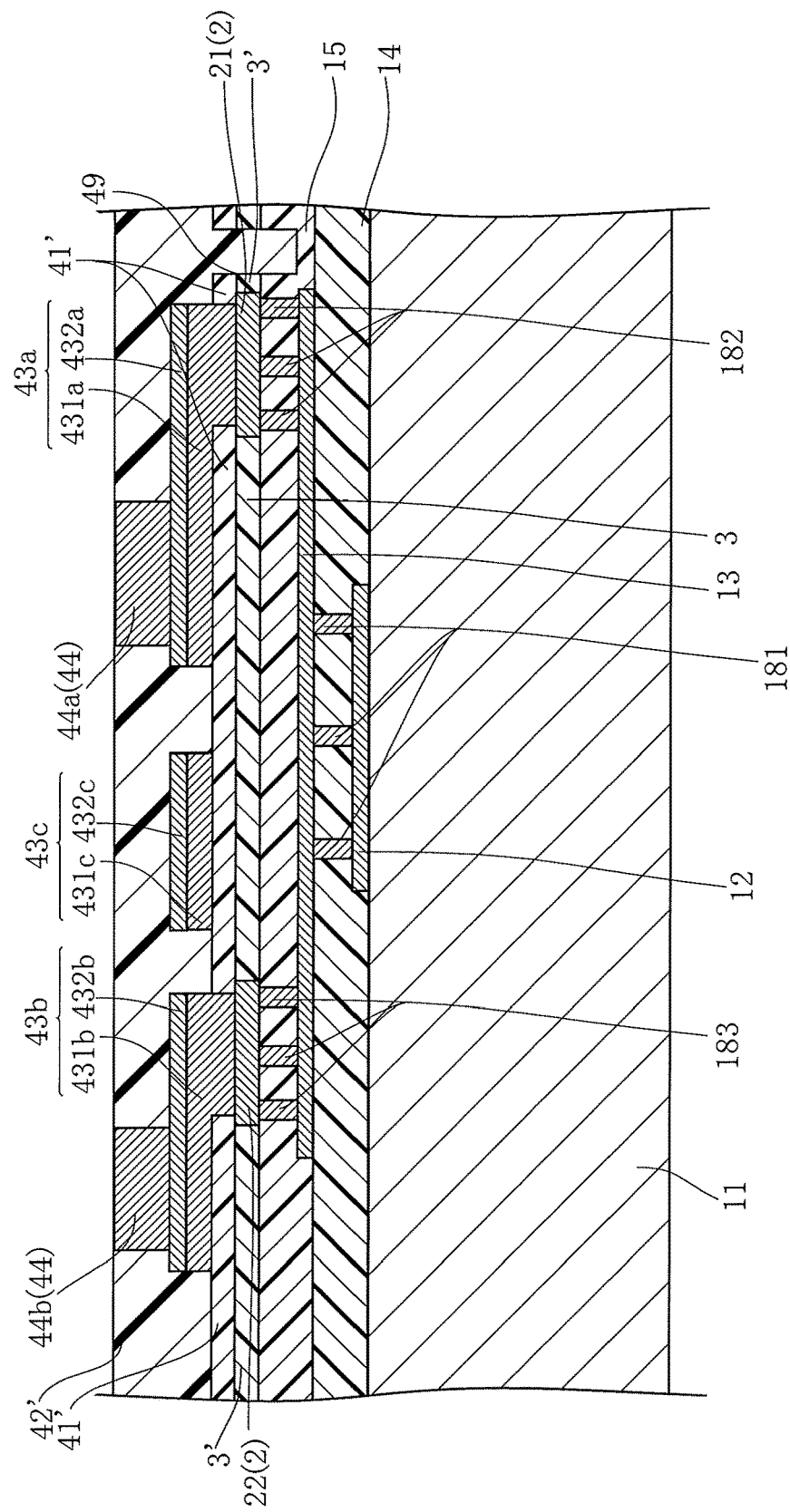
FIG. 13 is a schematic sectional view showing a step in the process of making the semiconductor device according to the first embodiment of the present invention.
Figure 14:
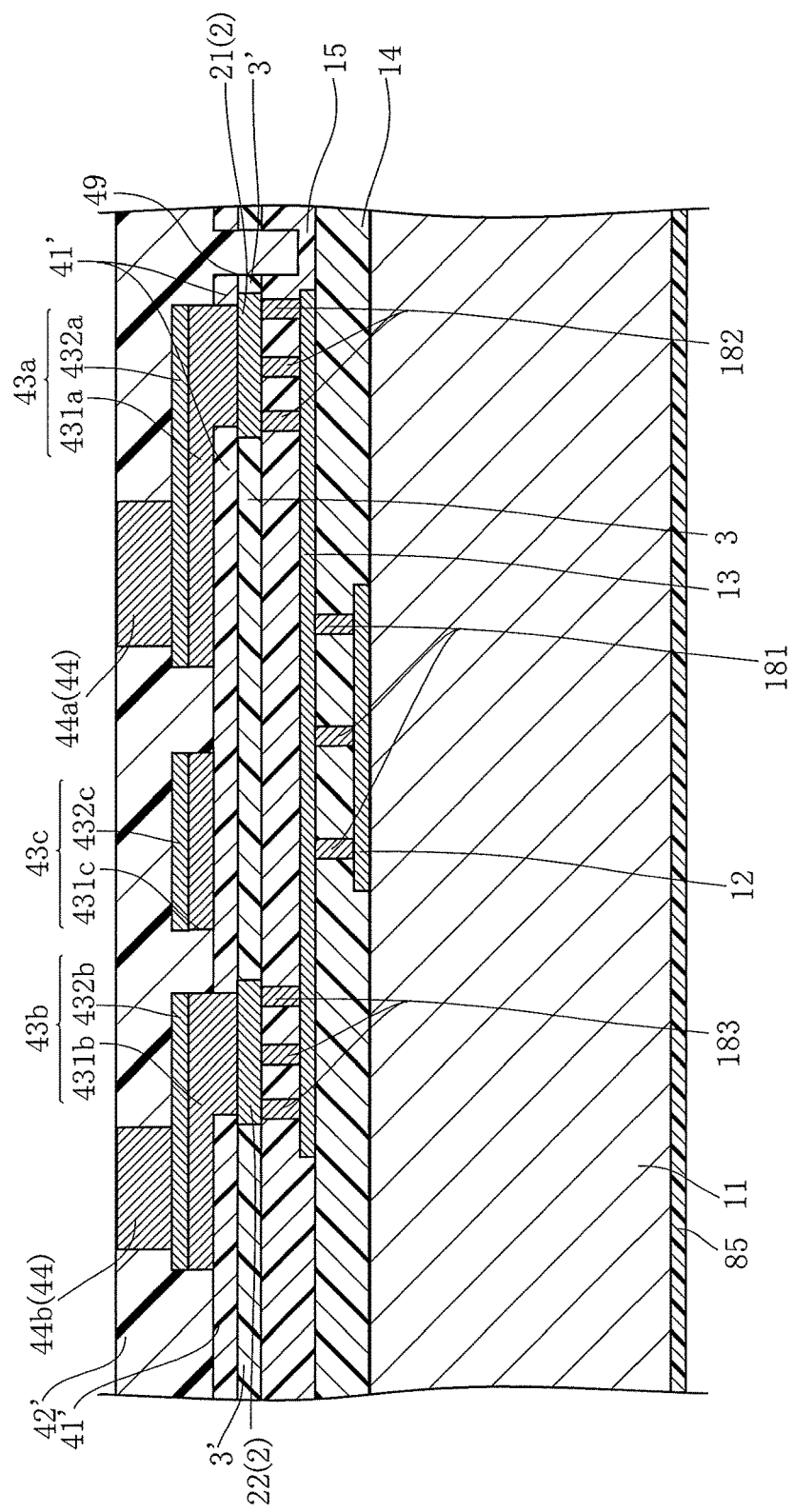
FIG. 14 is a schematic sectional view showing a step in the process of making the semiconductor device according to the first embodiment of the present invention.
Figure 15:
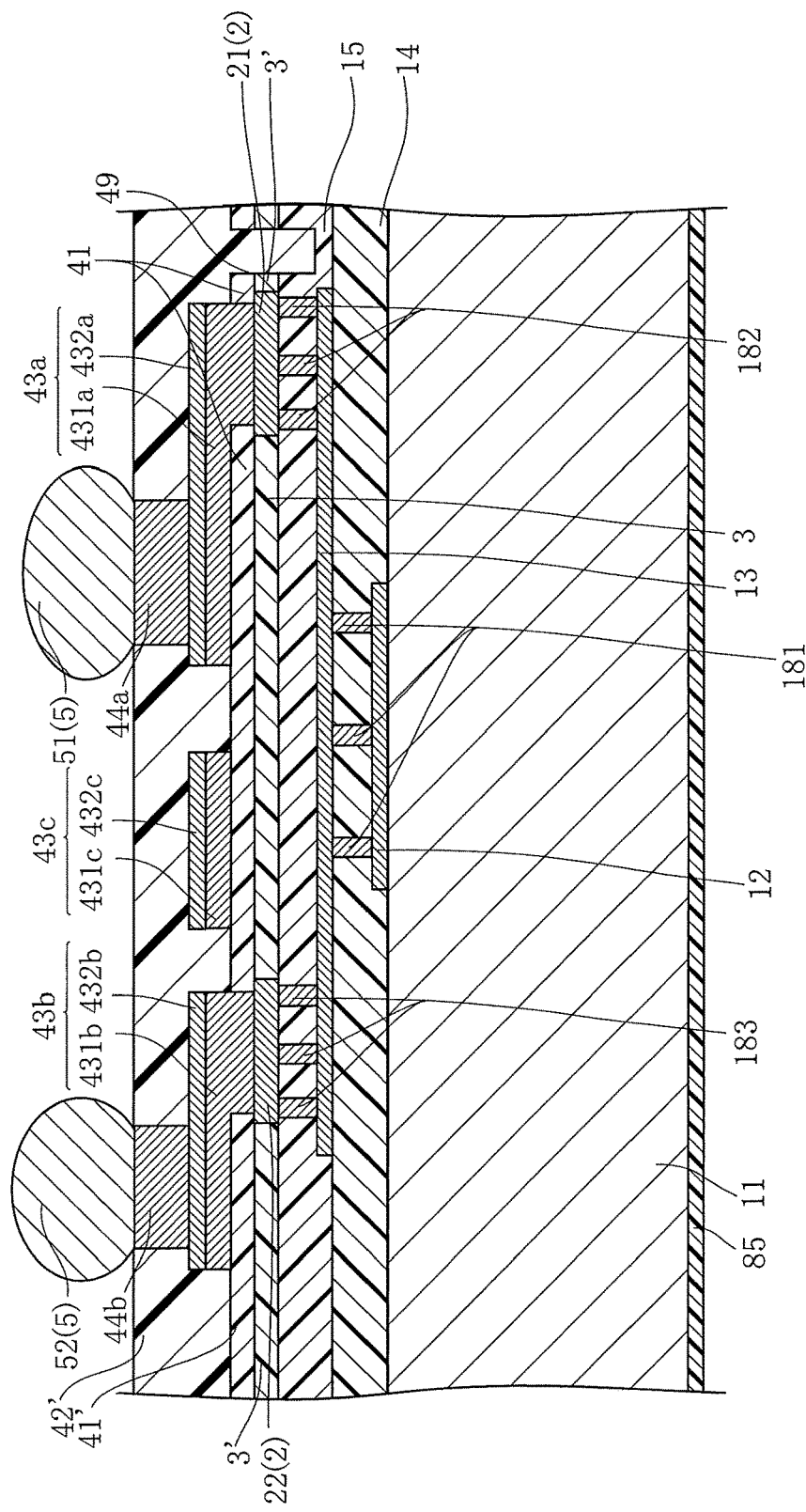
FIG. 15 is a schematic sectional view showing a step in the process of making the semiconductor device according to the first embodiment of the present invention.
Figure 16:
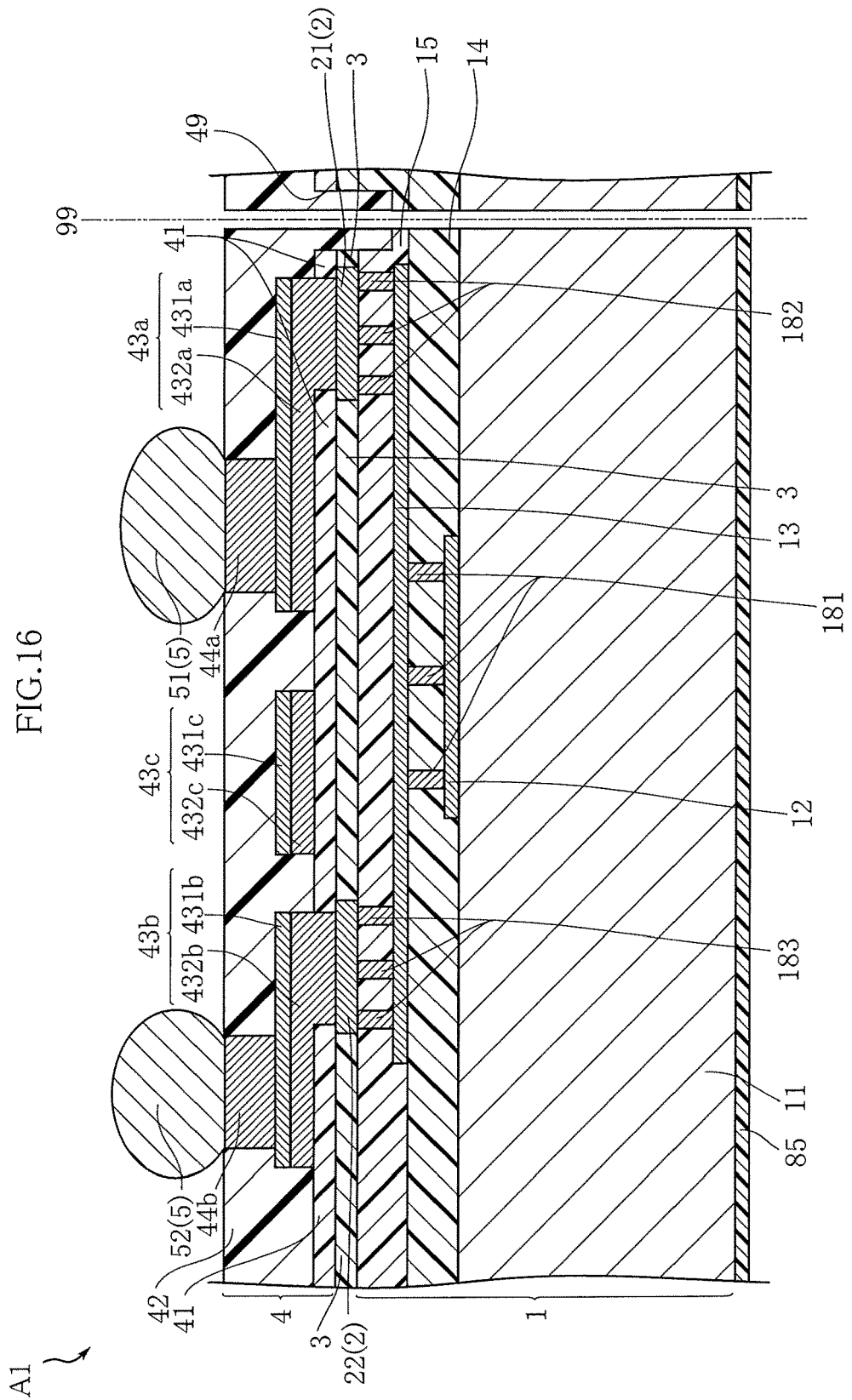
FIG. 16 is a schematic sectional view showing a step in the process of making the semiconductor device according to the first embodiment of the present invention.

Then, as shown in FIG. 10, etching is performed with respect to the base layer 431, whereby base layers 431a, 431b and 431c are formed. Then, as shown in FIG. 11, a groove 49 is formed by half cut dicing. Then, as shown in FIG. 12, a resin layer 42' is formed. Specifically, the resin-layer 42' is formed by printing. Then, as shown in FIG. 13, part of the resin layer 42' is removed to expose the posts 44 from the resin layer 42'. Then, the lower surface of the semiconductor substrate 11 is removed (not shown in the figure of this embodiment). Then, as shown in FIG. 14, a resin coat 85 is formed on the reverse surface of the semiconductor substrate 11. Then, as shown in FIG. 15, bumps 5 are formed. Specifically, the bumps 5 are formed by printing solder on the posts 44 and then performing reflow. Then, as shown in FIG. 16, the semiconductor substrate 11, the resin layer 42' and so on are collectively subjected to dicing along the line 99 passing through the groove 49. In this way, the semiconductor device A1 shown in FIG. 2 is made.

Figure 17:
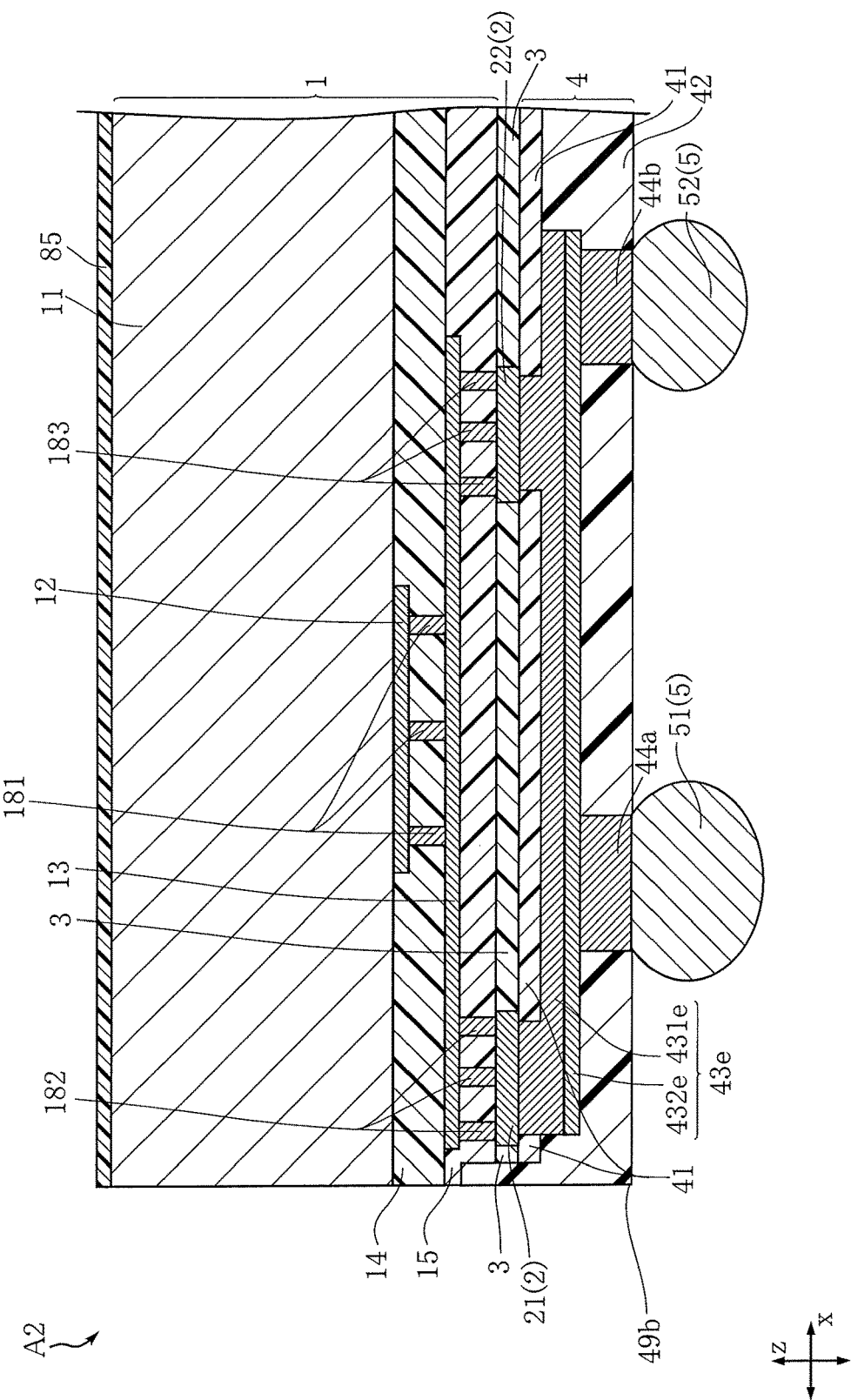
FIG. 17 is a schematic sectional view of a semiconductor device according to a second embodiment of the present invention.

FIGS. 17-23 show other embodiments of the present invention. In these figures, the elements that are identical or similar to those of the foregoing embodiment are designated by the same reference signs as those used for the foregoing embodiment. FIG. 17 is a schematic sectional view showing a semiconductor device according to a second embodiment of the present invention. The semiconductor device A2 shown in the figure includes a semiconductor chip 1, a plurality of electrode pads 2, a coating film 3, an intermediate layer 4, a plurality of bumps 5 and a resin coat 85. The semiconductor device A2 differs from the semiconductor device A1 in that it does not include the re-distribution layers 43a, 43b, 43c but includes the re-distribution layer 43e. In the semiconductor device A2, not only the wiring layer 13 but also the re-distribution layer 43e electrically connect the first electrode pad 21 and the second bump 52 to each other. Since the respective structures of the semiconductor chip 1, electrode pads 2, coating film 3 and bumps 5 of this embodiment are the same as those of the foregoing embodiment, the description of them is omitted.

In this embodiment, the intermediate layer 4 includes a stress buffer layer 41, a resin layer 42, the re-distribution layer 43e and posts 44a, 44b. Since the structures of the stress buffer layer 41 and the resin layer 42 are the same as those of the foregoing embodiment, the description of them is omitted.

The re-distribution layer 43e includes a base layer 431e and a metal layer 432e. Part of the base layer 431e penetrates the stress buffer layer 41. Part of the base layer 431e is laminated on the stress buffer layer 41. The base layer 431e is in contact with both of the first electrode pad 21 and 22. The base layer 431e prevents the first electrode pad 21, 22 from corroding. The base layer 431e is made of a metal such as titanium, nickel, and titanium tungsten. The metal layer 432e is laminated on the base layer 431e. The metal layer 432e is made of a metal such as copper. In this embodiment, both of the posts 44a, 44b are arranged vertically on the re-distribution layer 43e.

The advantages of the semiconductor device A2 are described below.

In the semiconductor device A2, similarly to the semiconductor device A1, the first bump 51 is arranged at one end in the direction x and one end in the direction y. In the state in which the semiconductor device A2 is mounted on the mounting substrate 8 (not shown in this embodiment; see the first embodiment), out of the plurality of bumps 5, stress is easily applied to the first bump 51, so that the first bump 51 is likely to break due to fatigue. When the first bump 51 is broken due to fatigue, the current flow path from the first electrode pad 21 to the mounting pad 811 (not shown in this embodiment; see the first embodiment) through the first bump 51 is interrupted.

In the semiconductor device A2, the first electrode pad 21 is electrically connected to the mounting pad 811 through the second bump 52. Thus, even when the current flow path from the first electrode pad 21 to the mounting pad 811 through the first bump 51 is interrupted, the first electrode pad 21 can be electrically connected to the mounting pad 811 through the second bump 52. Thus, the semiconductor device A2 prevents malfunction due to the interruption of the current path from the first electrode pad 21 to the mounting pad 811 through the first bump 51.

In the semiconductor device A2, similarly to the semiconductor device A1, the bonding area S3 between the post 44a and the first bump 51 is larger than the bonding area S4 between the post 44b and the second bump 52. This structure reduces the stress applied to the first bump 51. Thus, the semiconductor device A2 is suitable for preventing the breakage of the first bump 51 due to fatigue and hence preventing the above-described malfunction.

In the semiconductor device A2, similarly to the semiconductor device A1, the cross section S1 of the post 44a is larger than the cross section S2 of the post 44b. This arrangement also helps reducing the stress applied to the first bump 51. Further, this arrangement is suitable for reducing the resistance of the post 44a.

Figure 18:
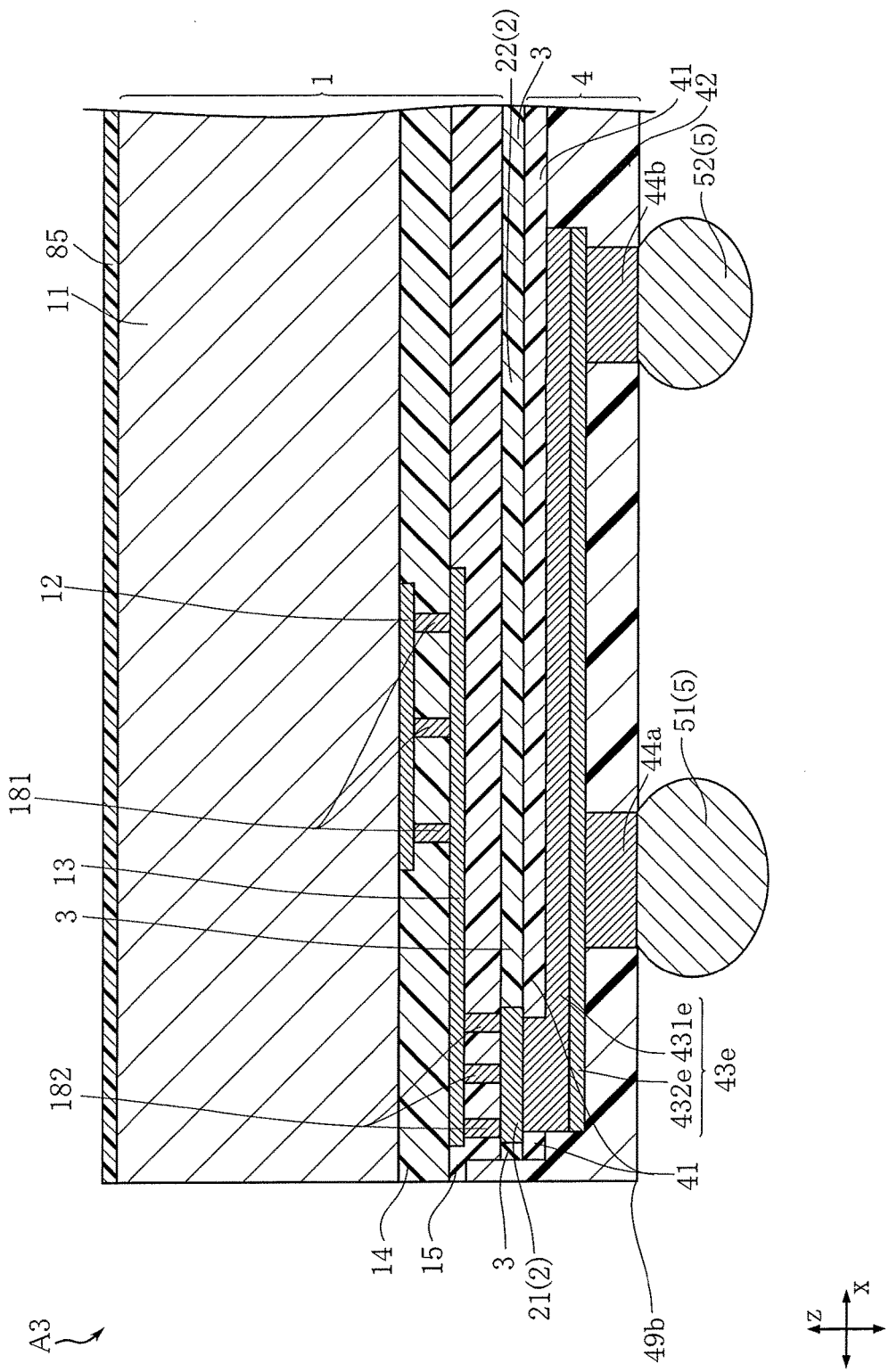
FIG. 18 is a schematic sectional view of a semiconductor device according to a third embodiment of the present invention.

FIG. 18 is a schematic sectional view showing a semiconductor device according to a third embodiment of the present invention. The semiconductor device A3 shown in the figure includes a semiconductor chip 1, a plurality of electrode pads 2, a coating film 3, an intermediate layer 4, a plurality of bumps 5, and a resin coat 85. The semiconductor device A3 differs from the semiconductor device A2 in that the first electrode pad 21 and the second bump 52 are electrically connected to each other only by the re-distribution layer 43e, not by the wiring layer 13.

In the semiconductor device A3, similarly to the semiconductor device A2, even when the current flow path from the first electrode pad 21 to the mounting pad 811 (not shown in this embodiment; see the first embodiment) through the first bump 51 is interrupted, the first electrode pad 21 can be electrically connected to the mounting pad 811 through the second bump 52. Thus, the semiconductor device A3 prevents malfunction due to the interruption of the current path from the first electrode pad 21 to the mounting pad 811 through the first bump 51.

In the semiconductor device A3, similarly to the semiconductor devices A1 and A2, the bonding area S3 between the post 44a and the first bump 51 is larger than the bonding area S4 between the post 44b and the second bump 52. This structure reduces the stress applied to the first bump 51. Thus, the semiconductor device A3 is suitable for preventing the breakage of the first bump 51 due to fatigue and hence preventing the above-described malfunction.

In the semiconductor device A3, unlike the semiconductor device A1 and the semiconductor device A2, it is not necessary to electrically connect the first electrode pad 21 and the second bump 52 by the wiring layer 13. The first electrode pad 21 and the second bump 52 are electrically connected to each other by the re-distribution layer 43. The shape of the re-distribution layer 43e has a high degree of design freedom. Thus, the structure for electrically connecting the first electrode pad 21 and the second bump 52 can be obtained easily.

In the semiconductor device A3, similarly to the semiconductor devices A1 and A2, the cross section Si of the post 44a is larger than the cross section S2 of the post 44b. This arrangement also helps reducing the stress applied to the first bump 51. Further, this arrangement is suitable for reducing the resistance of the post 44a.

Figure 19A:
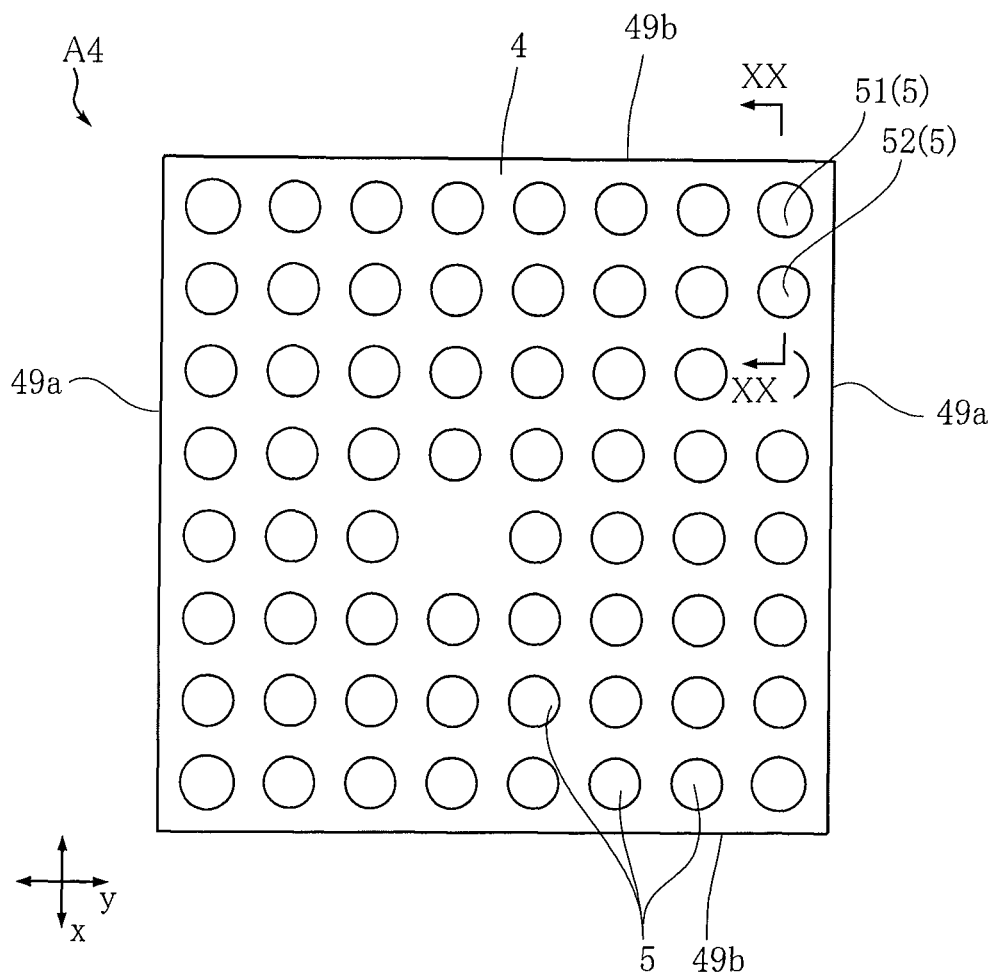
FIG. 19A is a bottom view of a semiconductor device according to a fourth embodiment of the present invention.
Figure 19B:
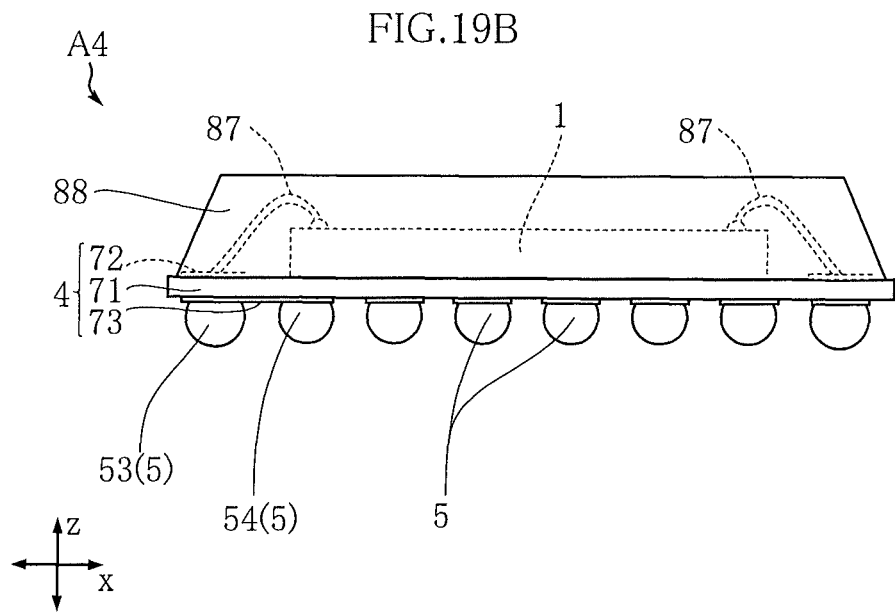
FIG. 19B is a side view (partially perspective) of a semiconductor device according to the fourth embodiment of the present invention.
Figure 20:
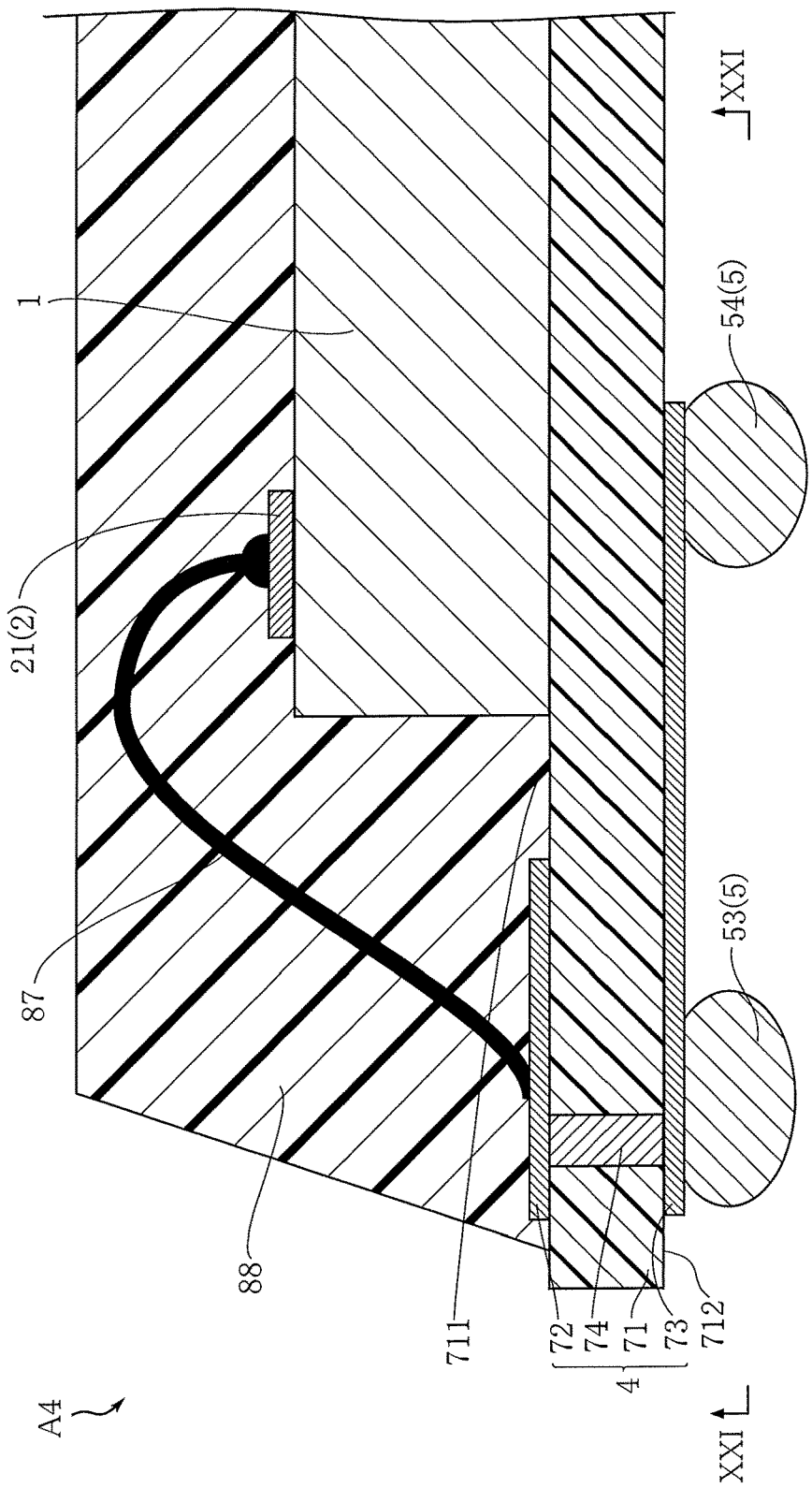
FIG. 20 is a schematic sectional view taken along lines XX-XX in FIG. 19A.

The fourth embodiment of the present invention is described below with reference to FIGS. 19A-22. FIG. 19A is a bottom view of the semiconductor device according to this embodiment. FIG. 19B is a side view (partially perspective) of the semiconductor device according to this embodiment. FIG. 20 is a schematic sectional view taken along lines XX-XX in FIG. 19A. FIG. 21 is a schematic sectional view taken along lines XXI-XXI in FIG. 20.

The semiconductor device A4 shown in these figures includes a semiconductor chip 1, a plurality of electrode pads 2, an intermediate layer 4, a plurality of bumps 5, a plurality of wires 87 and a sealing resin 88. The semiconductor device A4 is a BGA (Ball Grid Array) type semiconductor device.

Since the respective structures of the semiconductor chip 1 and the electrode pads 2 are the same as those of the third embodiment, the description of them is omitted.

The intermediate layer 4 in this embodiment is a wiring board. The intermediate layer 4 includes at least a substrate 71, an obverse surface wiring layer 72, a reverse surface wiring layer 73, and a through-hole electrode 74. On the intermediate layer 4 is mounted the semiconductor chip 1. As shown in FIG. 19A, the intermediate layer 4 is in the form of a rectangle defined by first edges 49a extending in the direction x and second edges 49b extending in the direction y.

The substrate 71 is made of e.g. epoxy resin. The substrate 71 has an obverse surface 711, and a reverse surface 712 facing away from the obverse surface 711.

The obverse surface wiring layer 72, the reverse surface wiring layer 73, and the through-hole electrode 74 are made of e.g. copper.

The obverse surface wiring layer 72 is provided on the obverse surface 711. The reverse surface wiring layer 73 is provided on the reverse surface 712. The through-hole electrode 74 penetrates the substrate 71 from the obverse surface 711 to the reverse surface 712. The through-hole electrode 74 is in contact with both of the obverse surface wiring layer 72 and the reverse surface wiring layer 73. Thus, the obverse surface wiring layer 72 and the reverse surface wiring layer 73 are electrically connected to each other.

The wires 87 are made of e.g. copper, aluminum or gold. As shown in FIG. 20, one of the wires 87 is in contact with the first electrode pad 21 and the main surface wiring layer 72. Thus, the first electrode pad 21 and the main surface wiring layer 72 are electrically connected to each other. The sealing resin 88 covers the semiconductor chip 1, the obverse surface wiring layer 72, the wires 87, etc. The sealing resin 88 is made of e.g. epoxy resin.

In this embodiment again, the plurality of bumps 5 are positioned opposite the semiconductor chip 1 across the intermediate layer 4. That is, the intermediate layer 4 is sandwiched between the bumps 5 and the semiconductor chip 1. As shown in FIG. 19A, in this embodiment, as viewed in the direction z, the plurality of bumps 5 are arranged in a matrix. Since the arrangement of the bumps 5 is the same as that of the foregoing embodiment, the description is omitted.

As shown in FIGS. 19A-21, the bumps 5 include a first bump 53 and a second bump 54. As shown in FIG. 19A, the first bump 53 is arranged at one end in the direction x and one end in the direction y. As shown in FIG. 20, the first bump 53 is bonded to the reverse surface wiring layer 73. The bonding area S5 (see FIG. 21) between the first bump 53 and the reverse surface wiring layer 73 is e.g. 17671-196350 $\mu m^2$. As viewed in the direction z, the first bump 53 has a circular shape having a diameter L5 (see FIG. 21). The diameter L5 is e.g. 150-500 $\mu m$. The first bump 53 is electrically connected to the first electrode pad 21 via the reverse surface wiring layer 73, the through-hole electrode 74, the obverse surface wiring layer 72 and the wire 87.

The second bump 54 is bonded to the reverse surface wiring layer 73. The second bump 54 is one of the plurality of bumps 5 that is adjacent to the first bump 53. However, the second bump 54 is not limited to the one adjacent to the first bump 53 and may be the one substantially at the center of the plurality of bumps 5. The bonding area S6 (see FIG. 21) between the second bump 54 and the reverse surface wiring layer 73 is e.g. 7854-125664 $\mu m^2$. It is preferable that the bonding area S5 is larger than the bonding area S6. For instance, it is preferable that the bonding area S5 is 1.1 to 1.5 times the bonding area S6. As viewed in the direction z, the second bump 54 has a circular shape having a diameter L6 (see FIG. 21). It is preferable that the diameter L5 is larger than the diameter L6. For instance, it is preferable that the diameter L6 is 1.1-1.5 times the diameter L5. For instance, the diameter L6 is 100-400 $\mu m$. The second bump 54 is electrically connected to the first electrode pad 21 via the reverse surface wiring layer 73, the through-hole electrode 74, the obverse surface wiring layer 72 and the wire 87. In this embodiment, the reverse surface wiring layer 73 electrically connects the first bump 53 and the second bump 54 to each other.

FIGS. 22 and 23 show the state in which the semiconductor device A4 is mounted on a mounting substrate 8. In mounting the semiconductor device A4 on the mounting substrate 8, the bumps 5 are bonded to the mounting pads 81 of the mounting substrate 8. Thus, the terminals (not shown) of the integrated circuit formed in the semiconductor substrate 11 are electrically connected to the mounting pads 81. Of the plurality of mounting pads 81, the mounting pad 811 to which the first bump 53 is bonded and the mounting pad 812 to which the second bump 54 is bonded are electrically connected to each other via the wiring 82 (not shown in FIG. 22) on the mounting substrate 8. Thus, the obverse surface wiring layer 72, the reverse surface wiring layer 73, the through-hole electrode 74, the wire 87 shown in FIG. 23, the first electrode pad 21, the first bump 53, the second bump 54, the mounting pads 811, 812 and the wiring 82 are electrically connected to each other.

All the bumps 5 positioned at the four corners may be configured to have the same structure as that of the first bump 53.

The advantages of the semiconductor device A4 are described below.

In the semiconductor device A4, the first bump 53 is arranged at one end in the direction x and one end in the direction y. In the state in which the semiconductor device A4 is mounted on the mounting substrate 8, out of the plurality of bumps 5, stress is easily applied to the first bump 53, so that the first bump 53 is likely to break due to fatigue. When the first bump 53 is broken due to fatigue, the current flow path from the first electrode pad 21 to the mounting pad 811 through the first bump 53 is interrupted.

In the semiconductor device A4, the first electrode pad 21 is electrically connected to the mounting pad 811 through the second bump 54. Thus, even when the current flow path from the first electrode pad 21 to the mounting pad 811 through the first bump 53 is interrupted, the first electrode pad 21 can be electrically connected to the mounting pad 811 through the second bump 54. Thus, the semiconductor device A4 prevents malfunction due to the interruption of the current path from the first electrode pad 21 to the mounting pad 811 through the first bump 53.

As shown in FIG. 21, in the semiconductor device A4, the bonding area S5 is larger than the bonding area S6. This structure reduces the stress applied to the first bump 53. Thus, the semiconductor device A4 is suitable for preventing the breakage of the first bump 53 due to fatigue and hence preventing the above-described malfunction.

On the obverse surface 711 of the substrate 71 is arranged the semiconductor chip 1. Further, the wire 87 needs to be connected to the obverse surface wiring layer 72. Thus, the degree of freedom of the shape of the obverse surface wiring layer 72 is low. On the other hand, only the bumps 5 are formed on the reverse surface wiring layer 73. Thus, the shape of the reverse surface wiring layer 73 can be selected relatively freely. This allows the first bump 53 and the second bump 54 to be electrically connected to each other relatively easily in the semiconductor device A4.

FIG. 24 is a schematic sectional view showing a semiconductor device according to a fifth embodiment of the present invention. The semiconductor device A5 shown in the figure differs from the semiconductor device A4 in that the obverse surface wiring layer 72 electrically connects the first bump 53 and the second bump 54 to each other. With this arrangement again, the above-described malfunction is prevented for the same reason as that described with respect to the semiconductor device A4.

The present invention is not limited to the foregoing embodiments. The specific structure of each part of the present invention can be varied in many ways. Although it is preferable that the diameter L1 is larger than the diameter L2, the diameter L1 may be smaller than the diameter L2 if only electrical connection of the first bump 51 and the second bump 52 to the first electrode pad 21 is provided. Similarly, the diameter L3 may be smaller than the diameter L4. Similarly, the diameter L5 may be smaller than the diameter L6. The area S1 may be smaller than the area S2. Similarly, the area S3 may be smaller than the area S4, and the area S5 may be smaller than the area S6.

Two or more of the bumps 5 may be configured to have the same function as that of the second bump 52 or the second bump 54.

The invention claimed is:

1. A semiconductor device comprising:
a semiconductor chip including a semiconductor substrate, a wiring layer formed directly on the semiconductor substrate, and an insulating layer covering the wiring layer;
a first electrode pad laminated on the insulating layer of the semiconductor chip;
a second electrode pad laminated on the insulating layer of the semiconductor chip;
an intermediate layer having a rectangular shape defined by a first edge and a second edge; and
a plurality of bumps arranged to sandwich the intermediate layer by cooperating with the semiconductor chip,
wherein the first edge extends in a first direction crossing a thickness direction of the semiconductor chip, the second edge extends in a second direction crossing both of the thickness direction and the first direction, the plurality of bumps include a first bump electrically connected to the first electrode pad, the plurality of bumps include a second bump electrically connected to the first electrode pad via the second electrode pad,
the first electrode pad and the second electrode pad are electrically connected to the wiring layer,
the first bump is placed along the first edge of the intermediate layer, and the second bump is placed along the second edge of the intermediate layer, and
a distance between the first bump and the second bump is greater than a length of the wiring layer in a direction in which the first bump and the second bump are spaced apart from each other.

2. The semiconductor device according to claim 1, further comprising a coating film that exposes the first electrode pad and the second electrode pad,
wherein the intermediate layer includes a stress buffer layer laminated on the coating film, a first re-distribution layer laminated on the stress buffer layer and a second re-distribution layer laminated on the stress buffer layer, the first re-distribution layer includes a portion that overlaps the first bump as viewed in the thickness direction, the second re-distribution layer includes a portion that overlaps the second bump as viewed in the thickness direction, and the first re-distribution layer and the second re-distribution layer are spaced apart from each other.

3. The semiconductor device according to claim 1, further comprising a coating film that exposes the first electrode pad and the second electrode pad,
wherein the intermediate layer includes a stress buffer layer laminated on the coating film and a re-distribution layer laminated on the stress buffer layer, and the re-distribution layer electrically connects the first bump and the second bump to each other.

4. The semiconductor device according to claim 1, further comprising a coating film that exposes the first electrode pad,
wherein the intermediate layer includes a stress buffer layer laminated on the coating film and a re-distribution layer laminated on the stress buffer layer, and the re-distribution layer electrically connects the first bump and the second bump to each other.

5. The semiconductor device according to claim 1, wherein the intermediate layer includes a first post extending in the thickness direction of the semiconductor chip and a second post extending in the thickness direction of the semiconductor chip, the first post is in contact with the first bump, and the second post is in contact with the second bump.

6. The semiconductor device according to claim 5, wherein a bonding area between the first post and the first bump is larger than a bonding area between the second post and the second bump.

7. The semiconductor device according to claim 5, wherein a cross section of the first post within a plane spreading in the first direction and the second direction is larger than a cross section of the second post within a plane spreading in the first direction and the second direction.

8. The semiconductor device according to claim 5, wherein the first post is in a form of a round column having a diameter of a first dimension and elongated in the thickness direction, and the second post is in a form of a round column having a diameter of a second dimension smaller than the first dimension and elongated in the thickness direction.

9. The semiconductor device according to claim 8, wherein the first dimension is 1.1 to 1.5 times the second dimension.

10. The semiconductor device according to claim 1, wherein the intermediate layer includes a substrate with an obverse surface and a reverse surface, an obverse surface wiring layer formed on the obverse surface, and a reverse surface wiring layer formed on the reverse surface, the reverse surface faces away from the obverse surface, the semiconductor chip is mounted on the obverse surface, the reverse surface wiring layer is electrically connected to the obverse surface wiring layer, and the reverse surface wiring layer is in contact with both of the first bump and the second bump.

11. The semiconductor device according to claim 1, wherein the first bump and the second bump are equal in volume.

12. The semiconductor device according to claim 1, wherein the plurality of bumps comprise at least twenty-five bumps.

13. The semiconductor device according to claim 1, wherein the first bump has a circular shape having a diameter of a first length as viewed in the thickness direction, and the second bump has a circular shape having a diameter of a second length smaller than the first length as viewed in the thickness direction.

14. The semiconductor device according to claim 13, wherein the first length is 1.1 to 1.5 times the second length.

15. The semiconductor device according to claim 1, wherein the second bump is closest to the first bump among the plurality of bumps.

16. The semiconductor device according to claim 1, wherein both of the first bump and the second bump are functional pins.

17. The semiconductor device according to claim 1, wherein the first bump is arranged at one end in the first direction and one end in the second direction.

18. The semiconductor device according to claim 4, wherein the intermediate layer further includes a resin layer laminated on the stress buffer layer or the re-distribution layer.

19. The semiconductor device according to claim 18, wherein the resin layer covers a side surface of the stress buffer layer.

20. The semiconductor device according to claim 19, wherein the resin layer further covers a side surface of the coating film.

21. The semiconductor device according to claim 18, further comprising a resin coat covering a reverse surface of the semiconductor chip.

22. The semiconductor device according to claim 18, wherein the re-distribution layer comprises a base layer and a metal layer.

23. The semiconductor device according to claim 22, wherein the base layer is made of one of titanium, nickel and titanium tungsten, and the metal layer is made of copper.

24. The semiconductor device according to claim 1, further comprising a first through via and a second through via, wherein the first through via is embedded in the insulating layer and electrically connected to the first electrode pad, and the second through via is embedded in the insulating layer and electrically connected to the second electrode pad, a distance between the first through via and the second through via is greater than a length of the wiring layer in a direction in which the first through via and the second through via are spaced apart from each other.

25. The semiconductor device according to claim 24, wherein the first through via is arranged not to overlap with the first bump as viewed in the thickness direction of the semiconductor chip.

* * * * *